(12) United States Patent
Odedra et al.

(10) Patent No.: US 11,643,422 B2
(45) Date of Patent: May 9, 2023

(54) ORGANOMETALLIC COMPOUNDS AND PURIFICATION OF SUCH ORGANOMETALLIC COMPOUNDS

(71) Applicant: SEASTAR CHEMICALS ULC, Sidney (CA)

(72) Inventors: Rajesh Odedra, Altrincham (GB); Cunhai Dong, Victoria (CA); Diana Fabulyak, Victoria (CA); Wesley Graff, Singapore (SG)

(73) Assignee: SEASTAR CHEMICALS ULC, Sidney (CA)

( * ) Notice: Subject to any disclaimer, the term of this patent is extended or adjusted under 35 U.S.C. 154(b) by 0 days.

(21) Appl. No.: 16/834,361

(22) Filed: Mar. 30, 2020

(65) Prior Publication Data
US 2020/0223877 A1    Jul. 16, 2020

Related U.S. Application Data

(60) Division of application No. 16/442,930, filed on Jun. 17, 2019, which is a continuation of application No. PCT/CA2018/050933, filed on Jul. 31, 2018.

(30) Foreign Application Priority Data

Aug. 2, 2017  (CA) ...................................... 2975104

(51) Int. Cl.
*C07F 7/22* (2006.01)
*G03F 7/09* (2006.01)
*G03F 7/16* (2006.01)

(52) U.S. Cl.
CPC .............. *C07F 7/2284* (2013.01); *G03F 7/09* (2013.01); *G03F 7/161* (2013.01); *G03F 7/167* (2013.01)

(58) Field of Classification Search
None
See application file for complete search history.

(56) References Cited

U.S. PATENT DOCUMENTS

| | | | |
|---|---|---|---|
| 4,108,990 A | 8/1978 | Plum et al. | |
| 8,703,237 B2 * | 4/2014 | Park ........................ | C23C 16/16 427/127 |

(Continued)

FOREIGN PATENT DOCUMENTS

| | | |
|---|---|---|
| CA | 1312700 C | 1/1993 |
| CA | 2920646 A1 | 8/2017 |

(Continued)

OTHER PUBLICATIONS

Jones et al. Proceedings of the Chemical Society, 1962, 358-359.*

(Continued)

*Primary Examiner* — Clinton A Brooks
(74) *Attorney, Agent, or Firm* — Faegre Drinker Biddle & Reath LLP

(57) ABSTRACT

Disclosed herein are methods of purifying compounds useful for the deposition of high purity tin oxide and high purity compounds purified by those methods. Such compounds are those of the Formula as follows $R_x\text{—Sn-A}_{4-x}$,
wherein:
  A is selected from the group consisting of $(Y_aR'_z)$ and a 3- to 7-membered N-containing heterocyclic group;
  each R group is independently selected from the group consisting of an alkyl or aryl group having from 1 to 10 carbon atoms;
  each R' group is independently selected from the group consisting of an alkyl, acyl or aryl group having from 1 to 10 carbon atoms;
  x is an integer from 0 to 4;
  a is an integer from 0 to 1;

(Continued)

NMR spectrum of Me₃SnNMe₂

Y is selected from the group consisting of N, O, S, and P; and z is 1 when Y is O, S or when Y is absent and z is 2 when Y is N or P.

21 Claims, 25 Drawing Sheets

(56) References Cited

U.S. PATENT DOCUMENTS

| | | | |
|---|---|---|---|
| 9,085,594 | B2 | 7/2015 | Modtland et al. |
| 2007/0117994 | A1 | 5/2007 | Shenai-Khatkhate et al. |
| 2009/0236745 | A1 | 9/2009 | Vrtis et al. |
| 2017/0102612 | A1 | 4/2017 | Meyers et al. |
| 2018/0155372 | A1 † | 6/2018 | Ryu |
| 2019/0337969 | A1 | 11/2019 | Odedra et al. |

FOREIGN PATENT DOCUMENTS

| | | |
|---|---|---|
| KR | 10-2013-0037569 A | 4/2013 |
| WO | 2016/065120 A1 | 4/2016 |

OTHER PUBLICATIONS

Dr. Deepack, published Feb. 24, 2016, https://lab-training.com/2016/02/24/how-to-select-the-optimum-laboratory-distillation-technique/.*

Jones, K et al., "Amino-derivatives of Metals and Metalloids. Part I. Preparation of Aminostannanes, Stannylamines, and Stannazanes," Journal of the Chemical Society, Mar. 1965, pp. 1944-1951.

Jones, K. et al., "Aminostannanes, Stannylamines, and Stannazanes," Proceedings of the Chemical Society, London, Nov. 1962, pp. 358-359.

Shane Harrypersad et al., "Alternating polystannanes: syntheses and properties," Chemical Communications, Jan. 2015, pp. 7120-7123, vol. 51, No. 33.

B. Jousseaume, "Product Subclass 14: Organostannylamines and Related Compounds," Science of Synthesis, Jan. 2003, pp. 401-408, vol. 5, No. 2.

Randall, E. W. et al., "Nuclear Magnetic Resonance Studies of Exchange in Stannylamines," Journal of the American Chemical Society, Jul. 5, 1967, vol. 89 (14), pp. 3438-3441.

Laurent, J. M. et al., "Morphology and physical properties of SnO2-based thin films deposited by the pyrosol process from dibutyltindiacetate," Thin Solid Films, vol. 292 (1-2), Jan. 5, 1997, pp. 145-149.

Barone, G. et al., "Structural distortions in homoleptic (RE)4A (E = O, S, Se; A =C, Si, Ge, Sn): implications for the CVD of tin sulfides"—J. Chem. Soc., Dalton Trans., 2001, pp. 3435-3445.

Written Opinion of the International Preliminary Examining Authority dated Jul. 2, 2019 issued in International patent application No. PCT/CA2018/050933.

International Preliminary Report on Patentability (IPRP) dated Oct. 18, 2019 issued in international patent application No. PCT/CA2018/050933.

U.S. Appl. No. 16/575,605, filed Sep. 19, 2019.

Theodore L. Brown et al., Chemistry: the Central Science, pp. 504-505, 2003, Pearson Education, Inc., Upper Saddle River, NJ.†

Safety Data Sheet, pp. 1-9, Jan. 8, 2016, Strem Chemicals Inc., Newburyport Massachusetts, US.†

K. Jones and M.F. Lappert, "Aminostannanes, Stannylamines, and Stannazanes" Proc. Chem. Soc., pp. 358-359, Jan. 1, 1962, Royal Society of Chemistry, London, United Kingdom.†

Strem: High Quality Chemicals for Research Since 1964, pp. 418-419, 2012-2014, Strem Chemicals Inc., Newburyport, Massachusetts, US.†

\* cited by examiner

† cited by third party

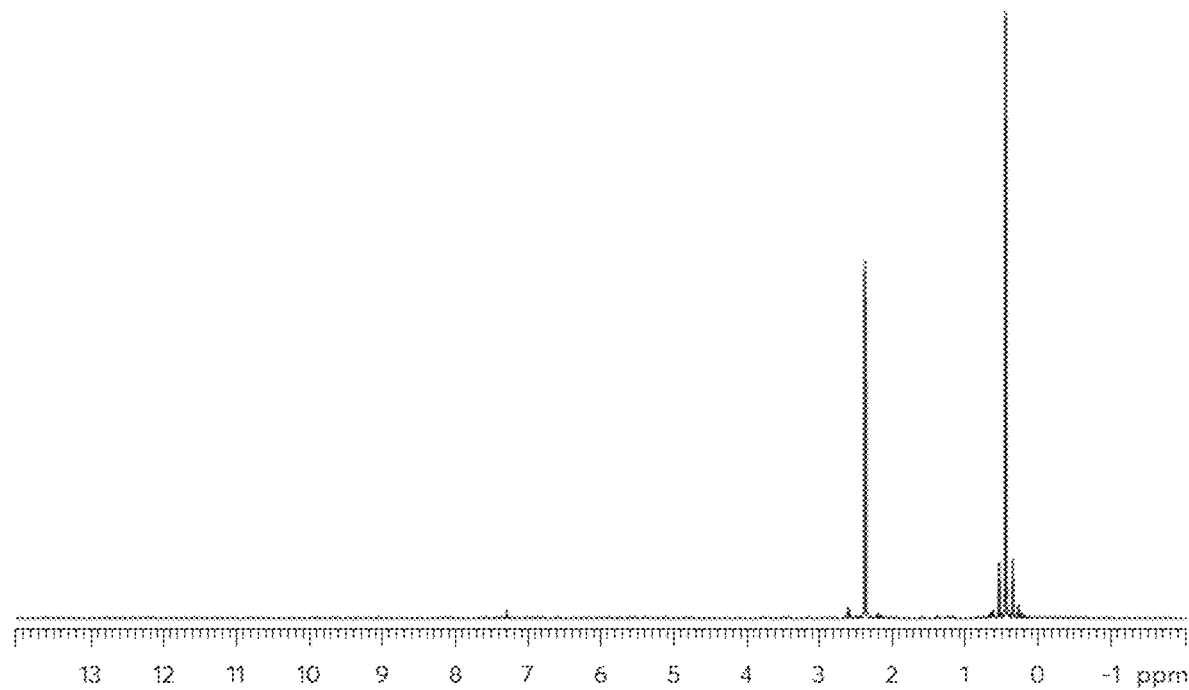
Figure 1: NMR spectrum of Me₃SnNMe₂

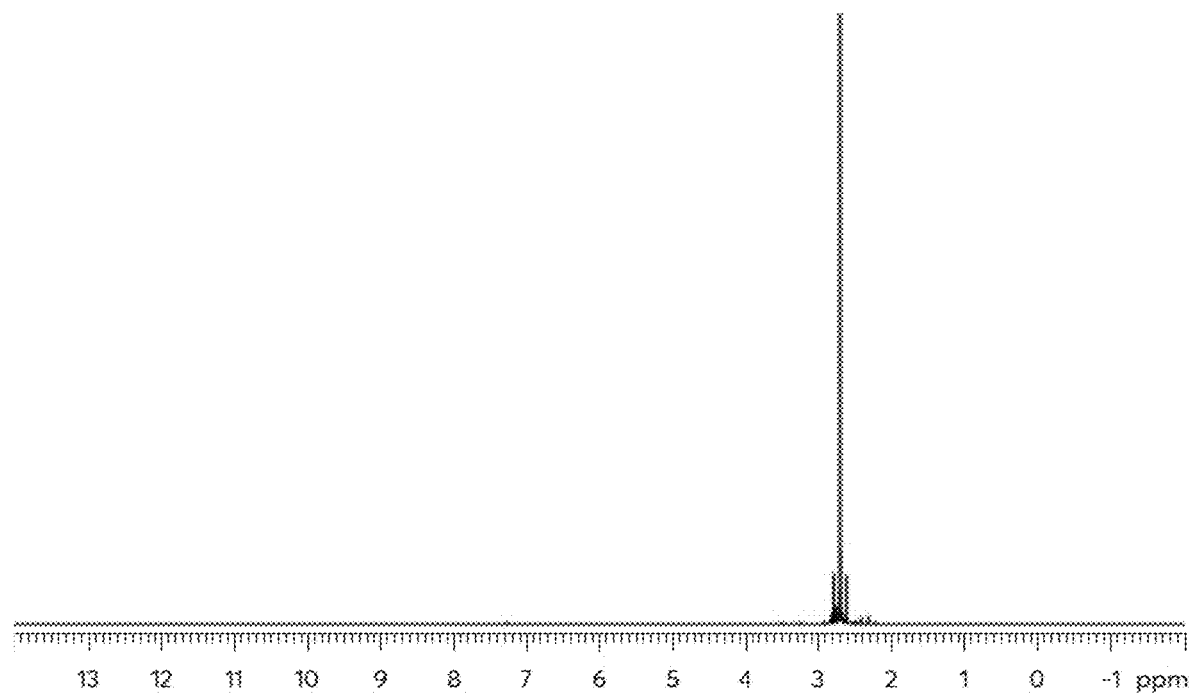
Figure 2: NMR spectrum of Sn(NMe$_2$)$_4$

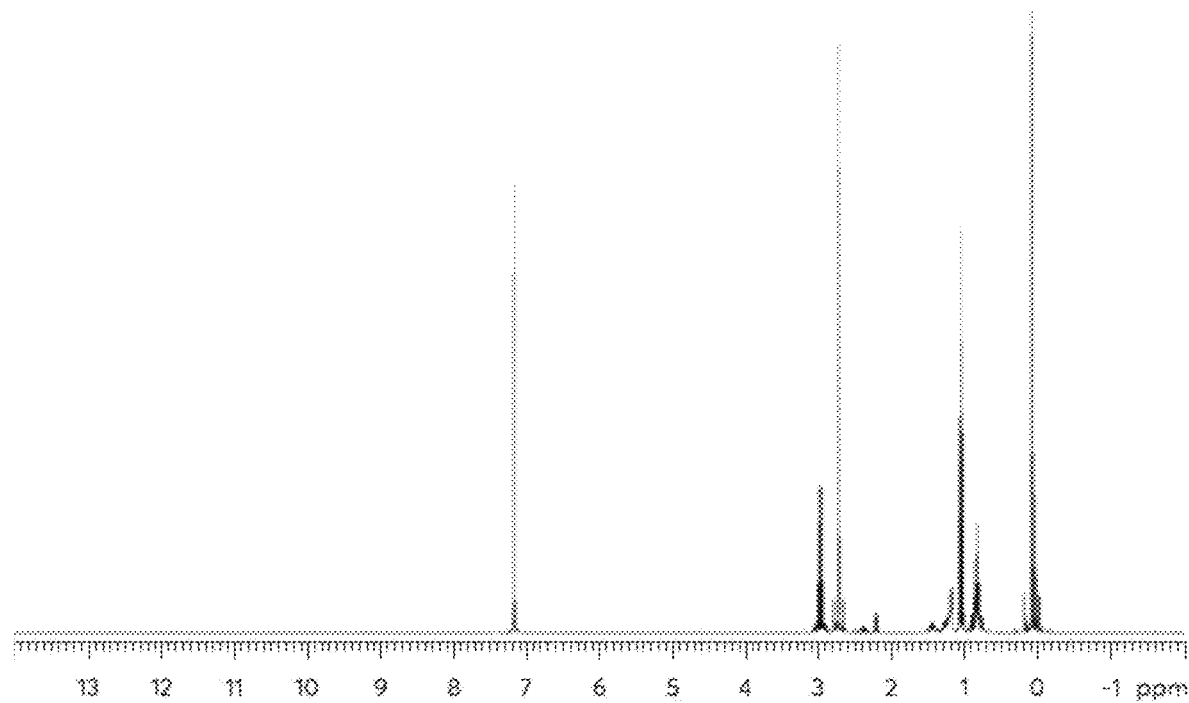
Figure 3: NMR of Me₂Sn(NEtMe)₂

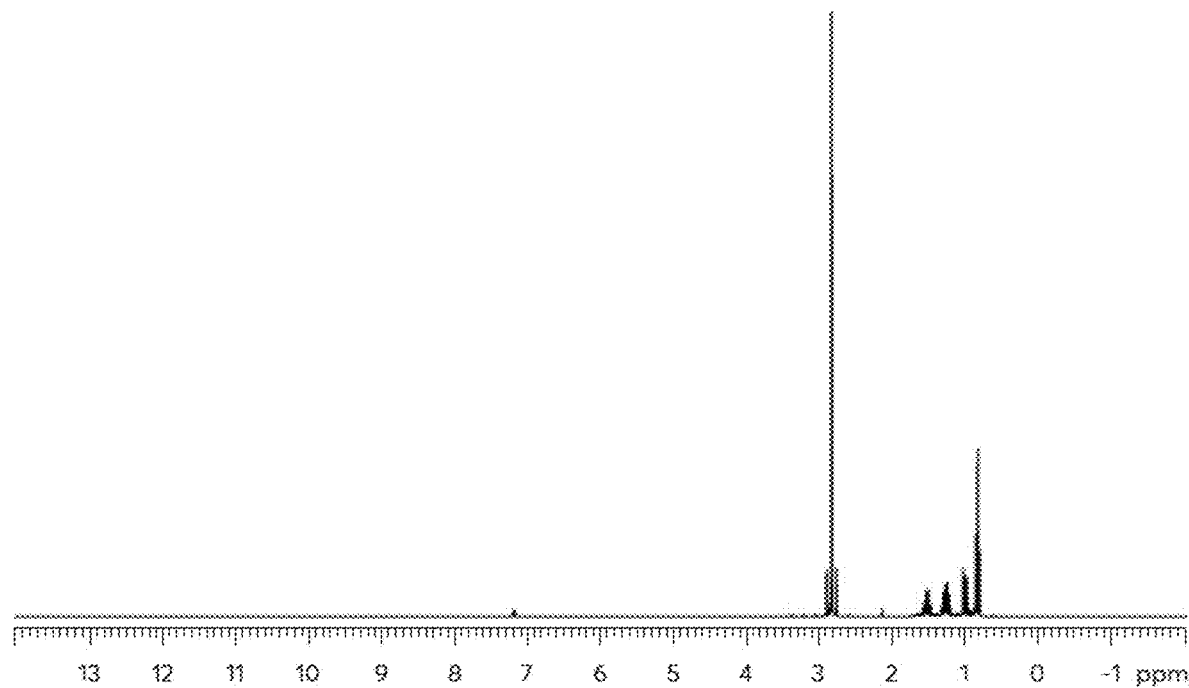
Figure 4: NMR of $Bu_2Sn(NMe_2)_2$

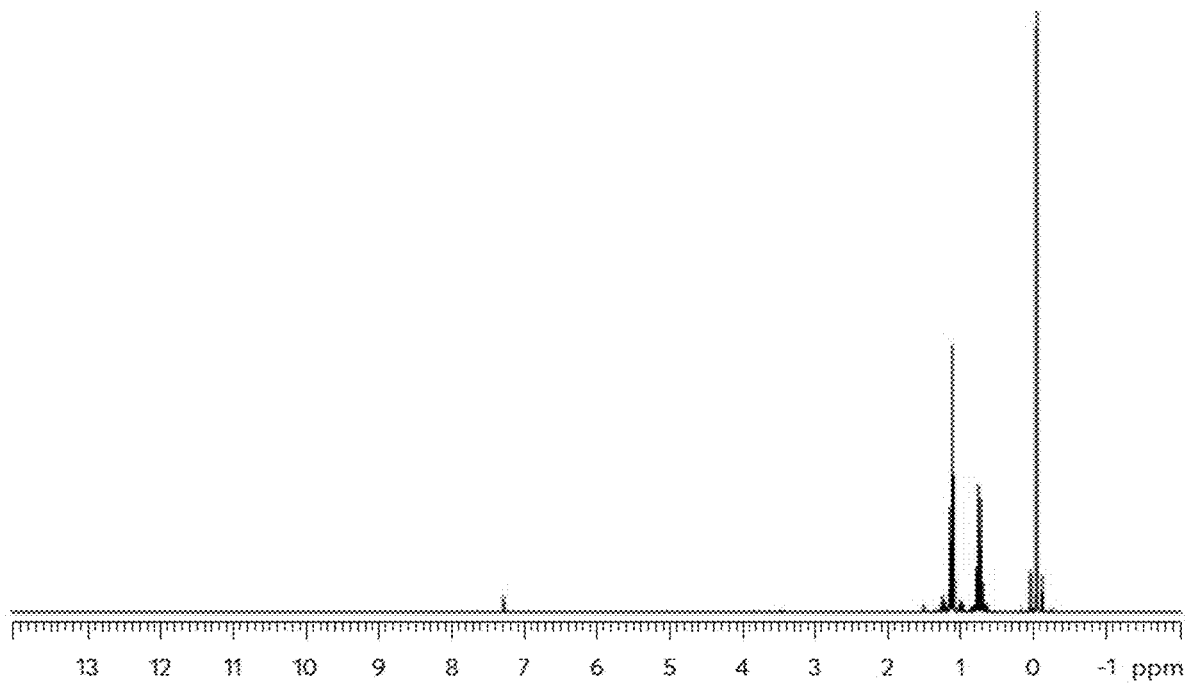
Figure 5: NMR of Me$_2$SnEt$_2$

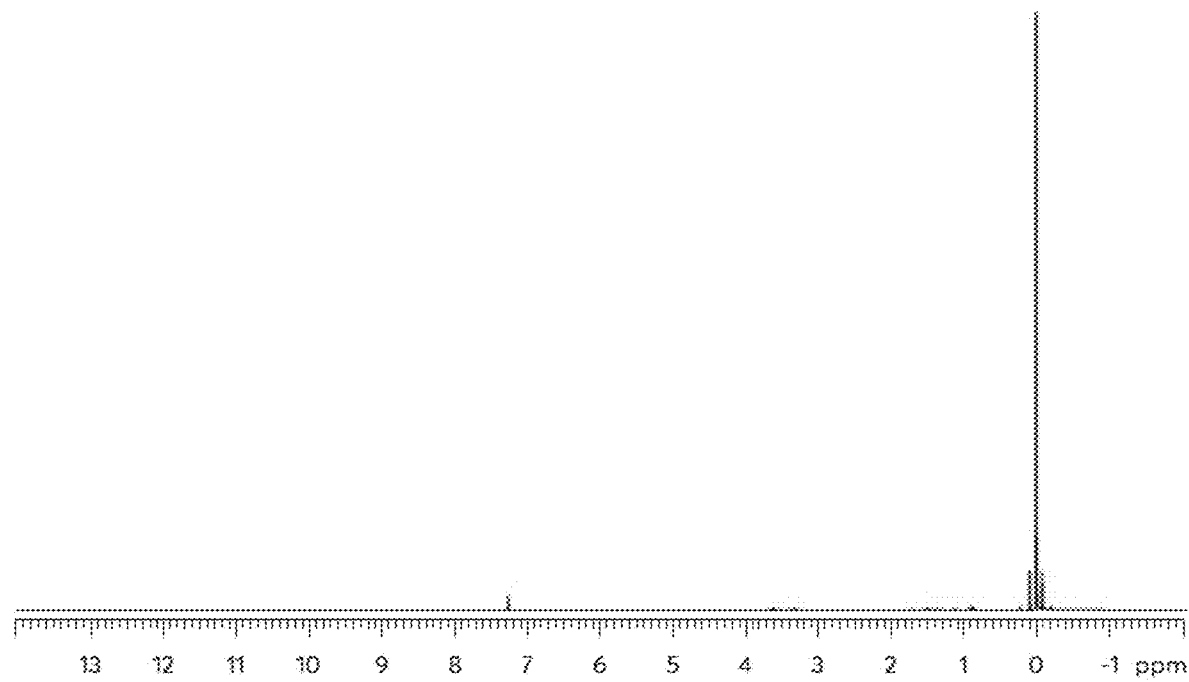
Figure 6: NMR of Me4Sn

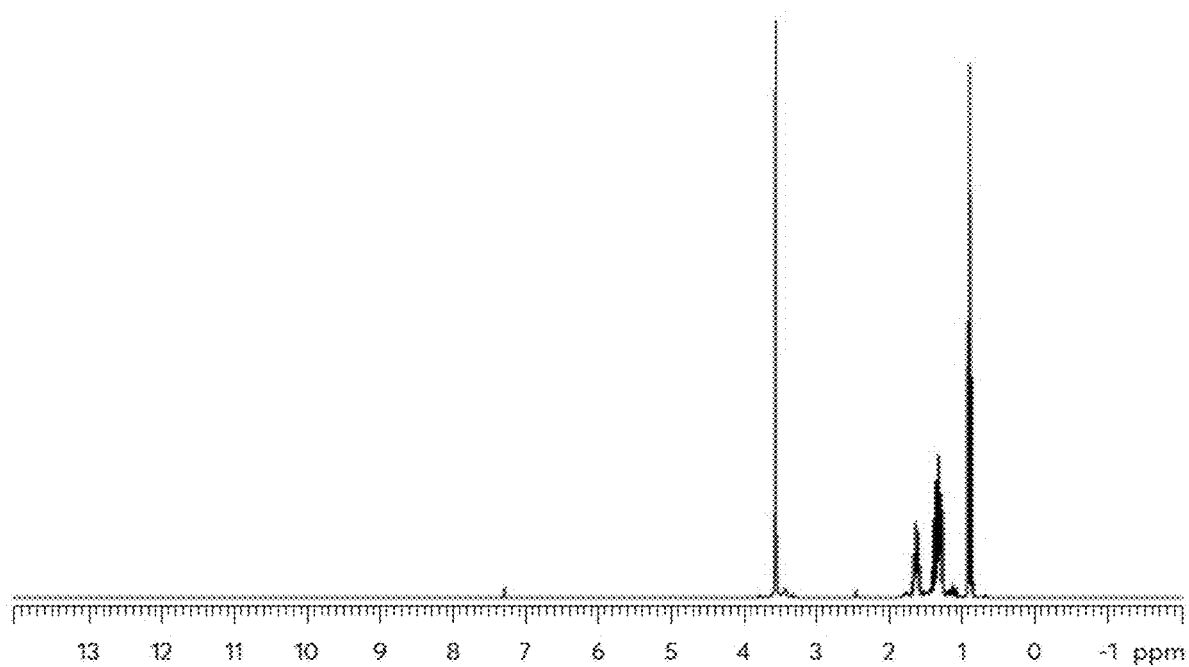
Figure 7: NMR of $Bu_2Sn(OMe)_2$

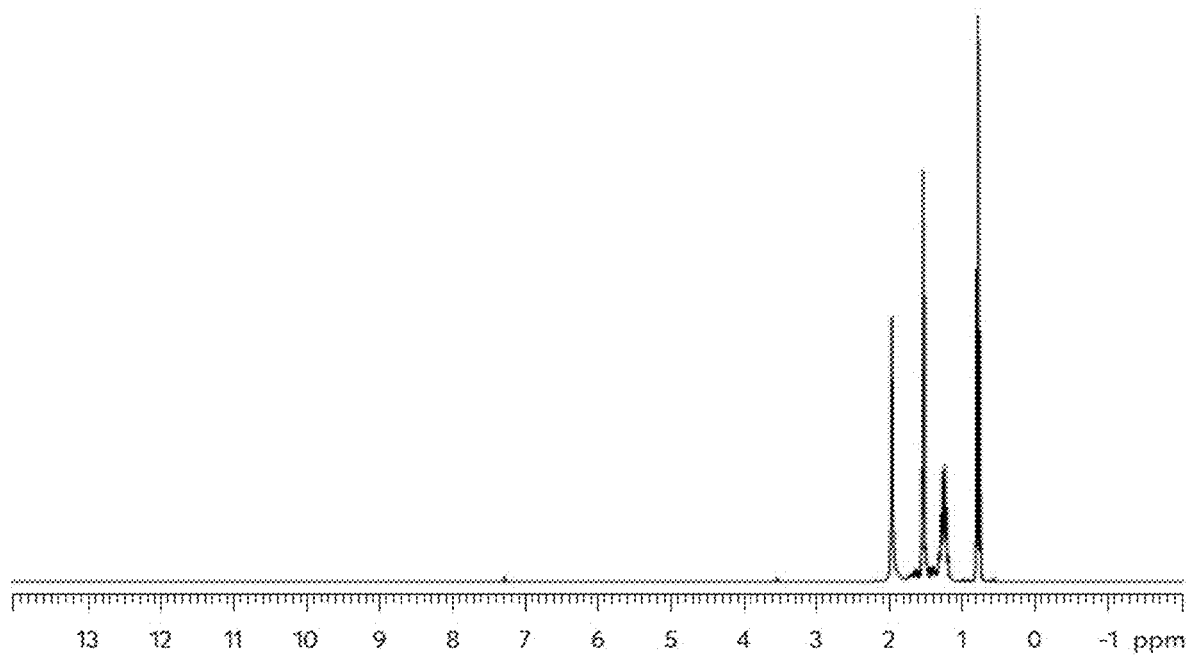
Figure 8: NMR of $Bu_2Sn(OAc)_2$

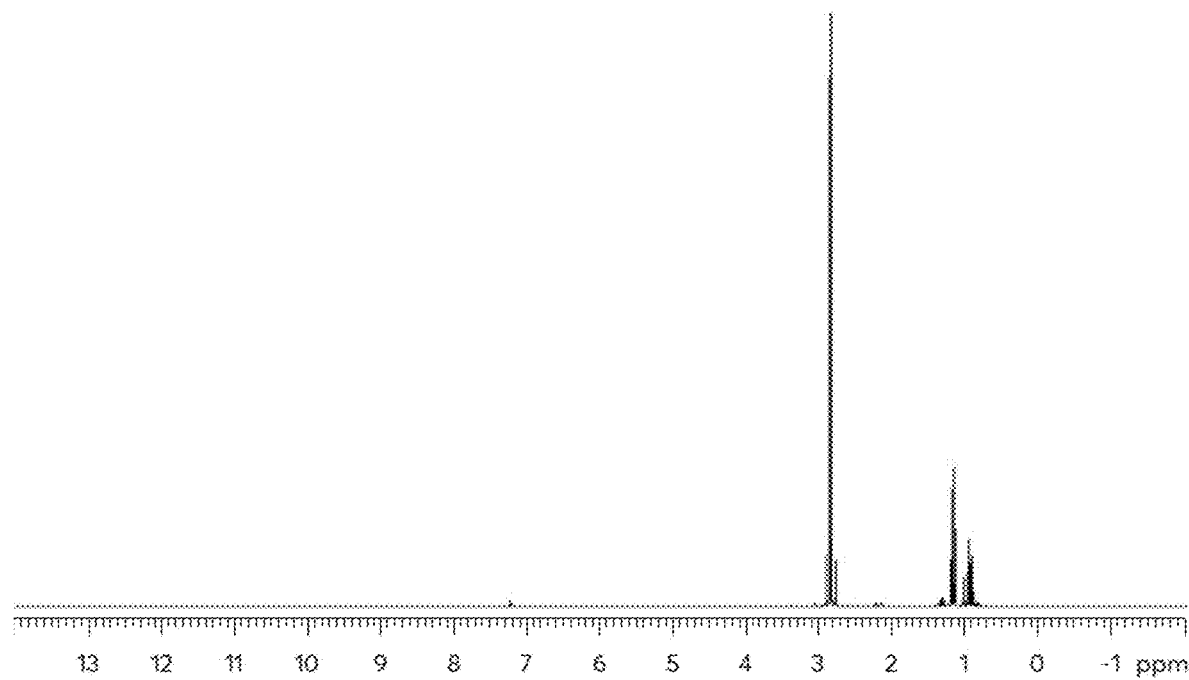
Figure 9: NMR of Et$_2$Sn(NMe$_2$)$_2$

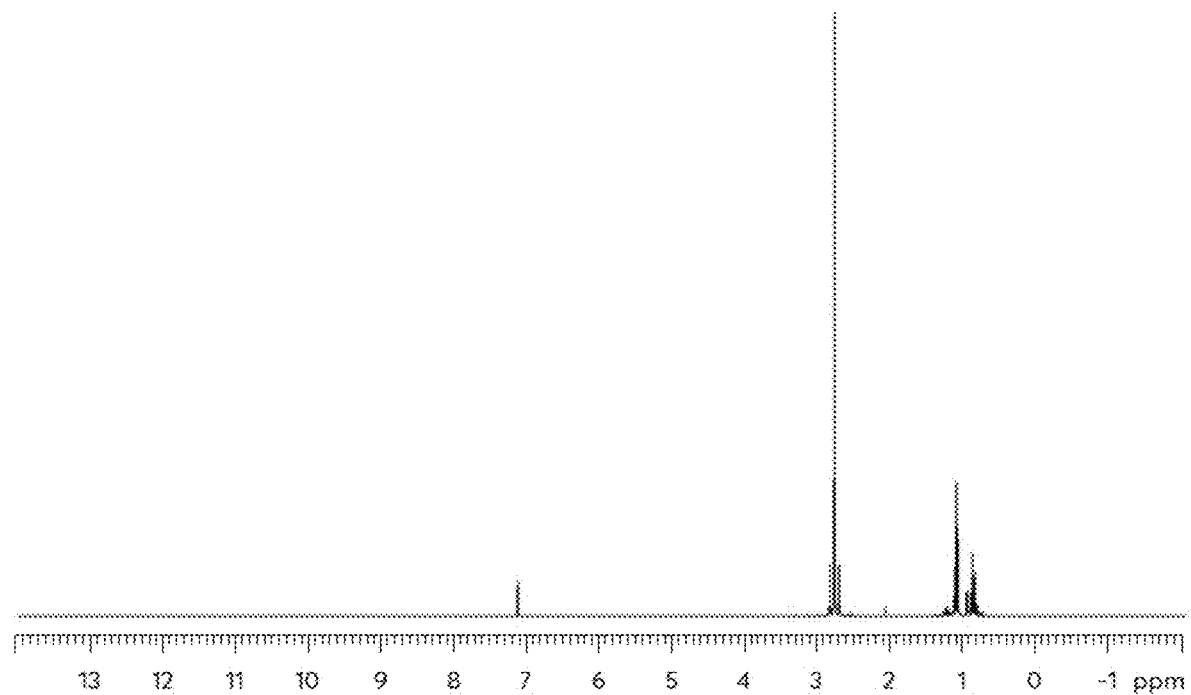
Figure 10: NMR of $Me_2Sn(NEt_2)_2$

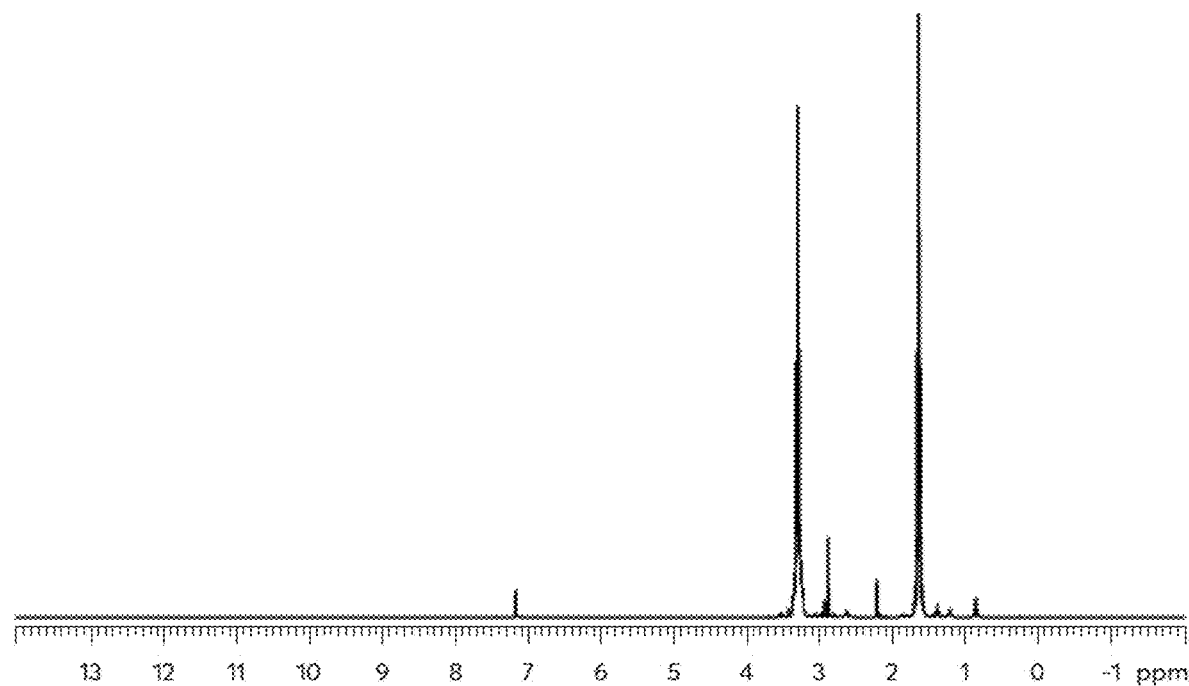
Figure 11: NMR of Sn(Pyrrolodinyl)₄

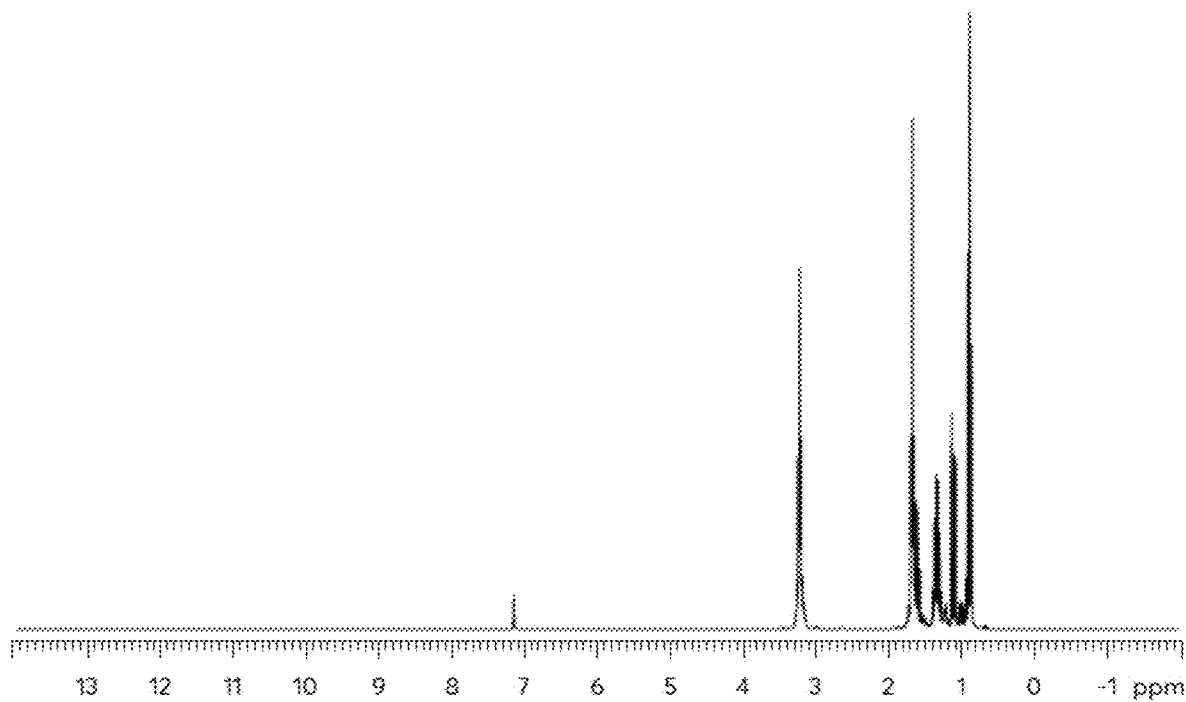
Figure 12: NMR of Bu$_2$Sn(Pyrrolodinyl)$_2$

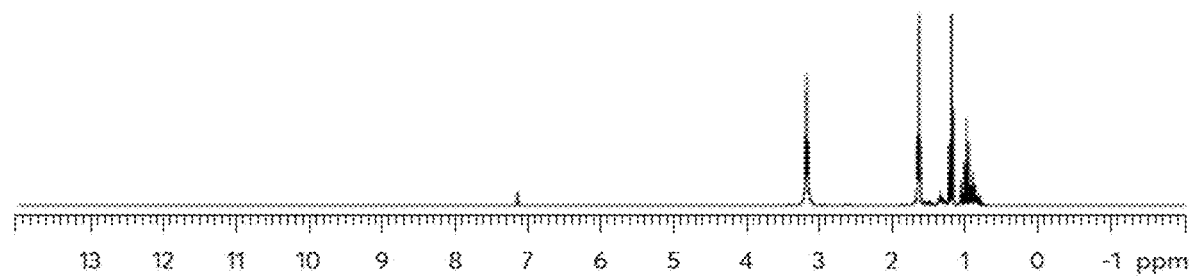
Figure 13: NMR of Et₂Sn(Pyrrolodinyl)₂

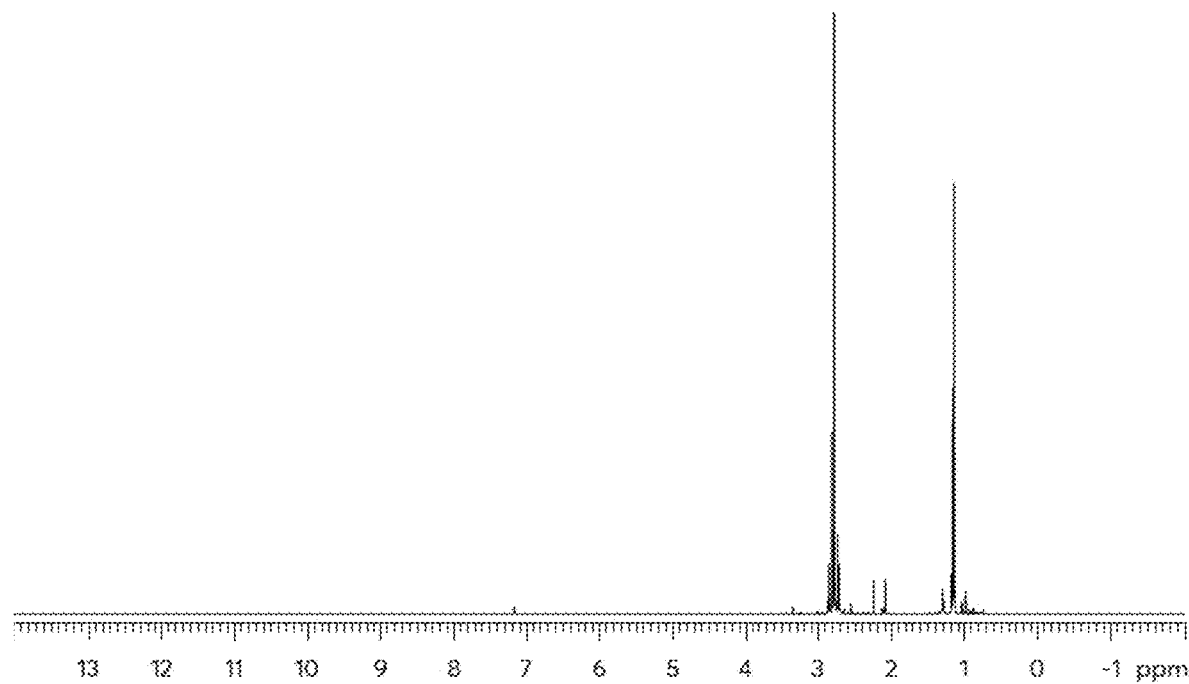
Figure 14: NMR of $Me_2Sn(NMe_2)_2$

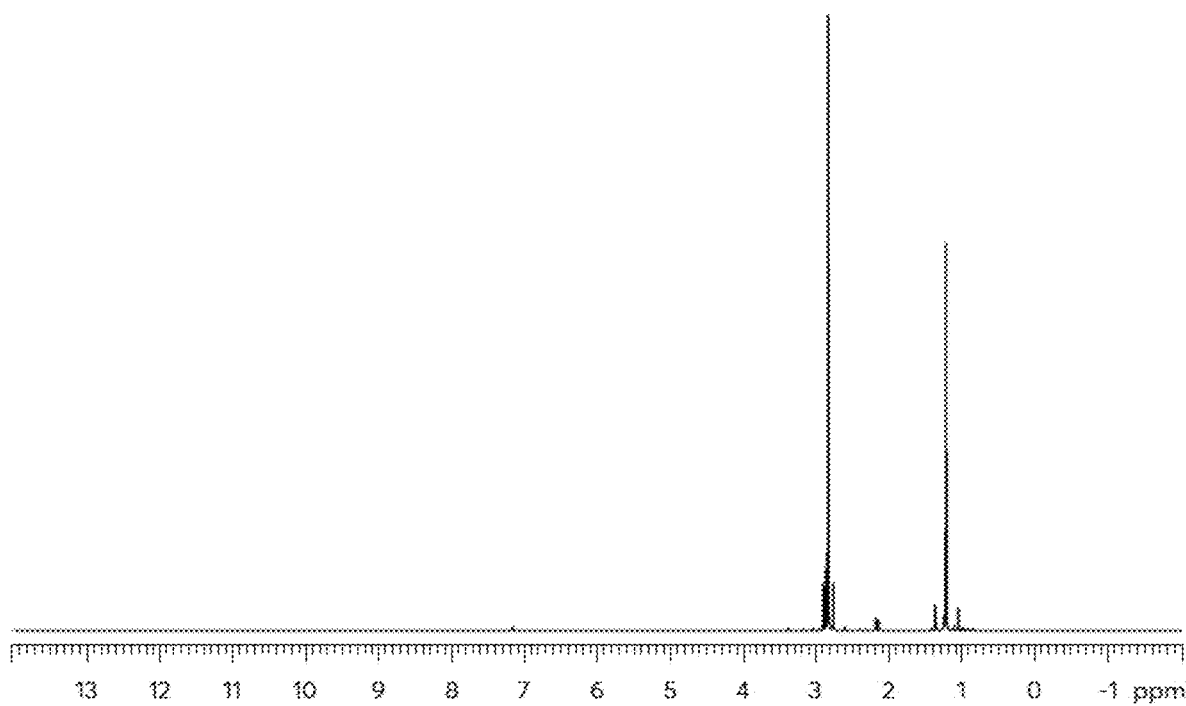
Figure 15: NMR of tBuSn(NMe$_2$)$_3$

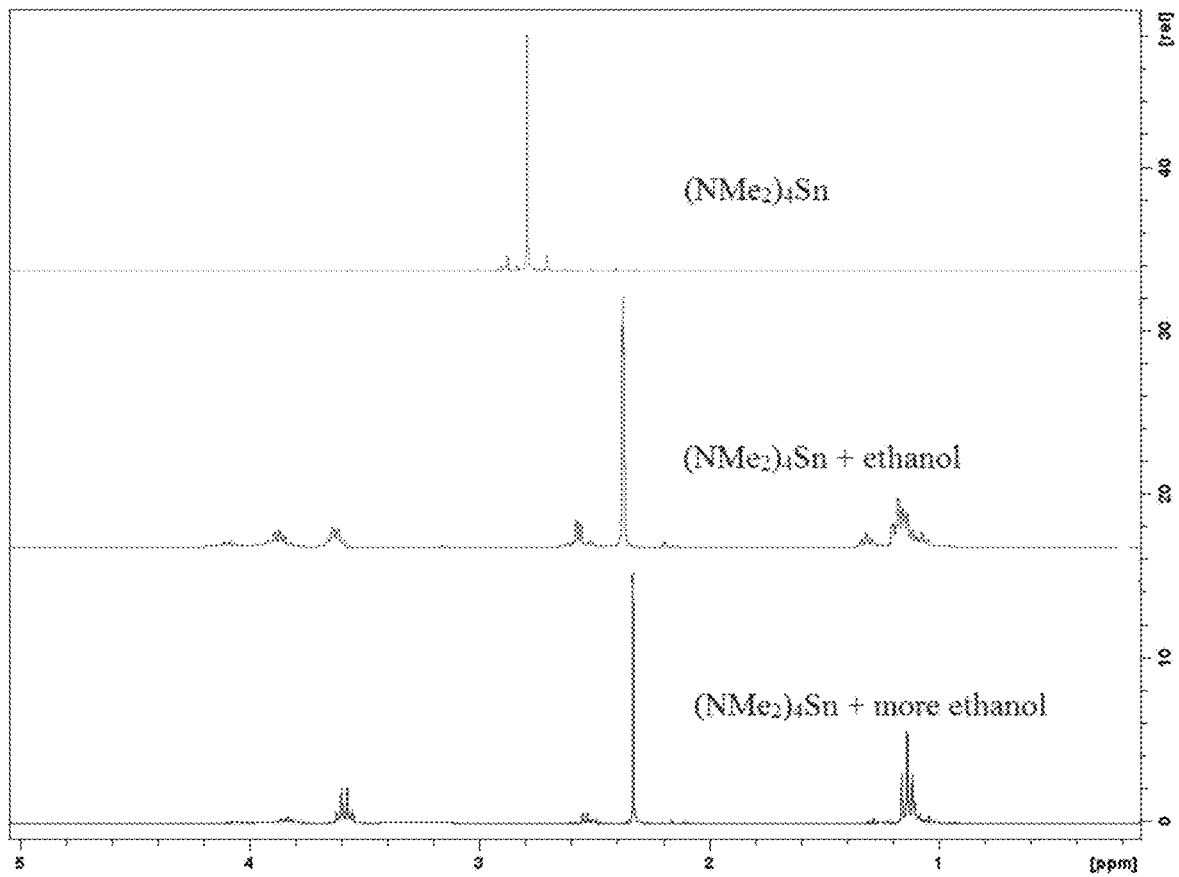
Figure 16. NMR of the reaction of (NMe2)4Sn with ethanol

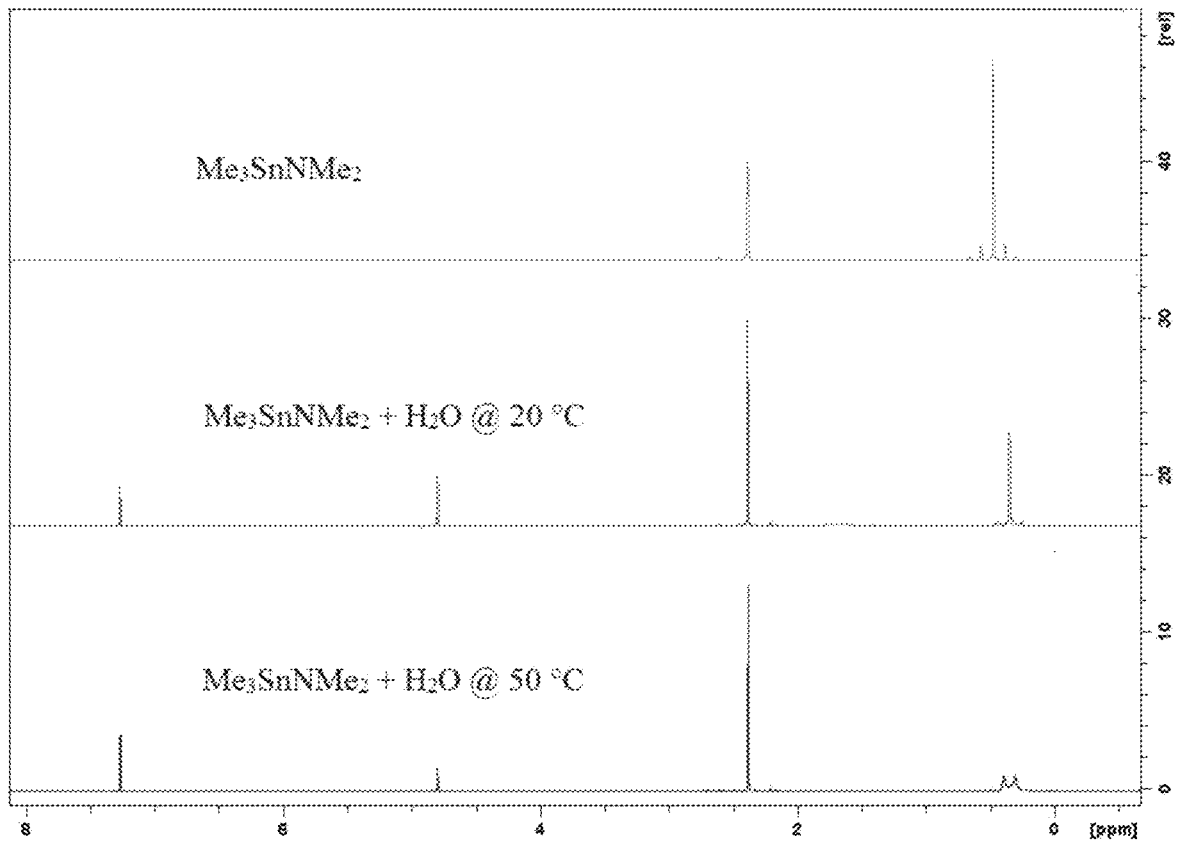
Figure 17. NMR of the reaction of $Me_3SnNMe_2$ with water.

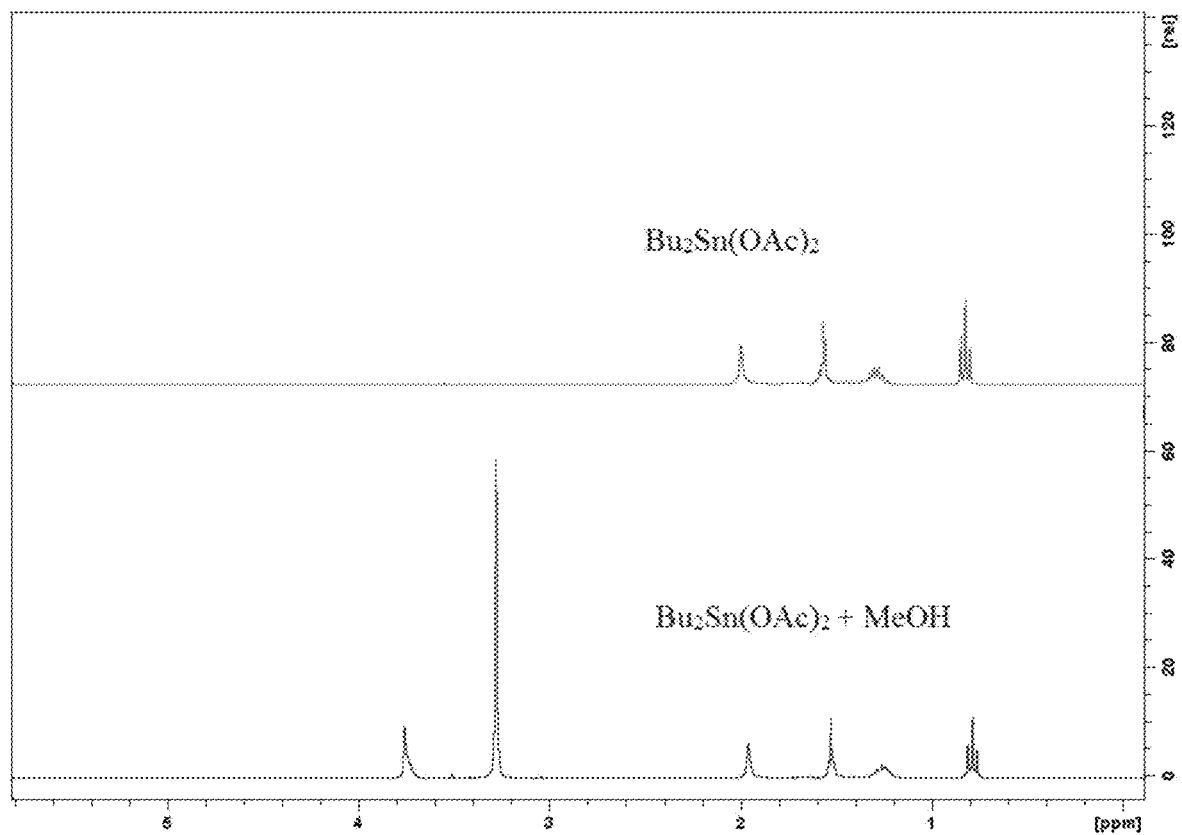
Figure 18. NMR of the reaction of $Bu_2Sn(OAc)_2$ with methanol.

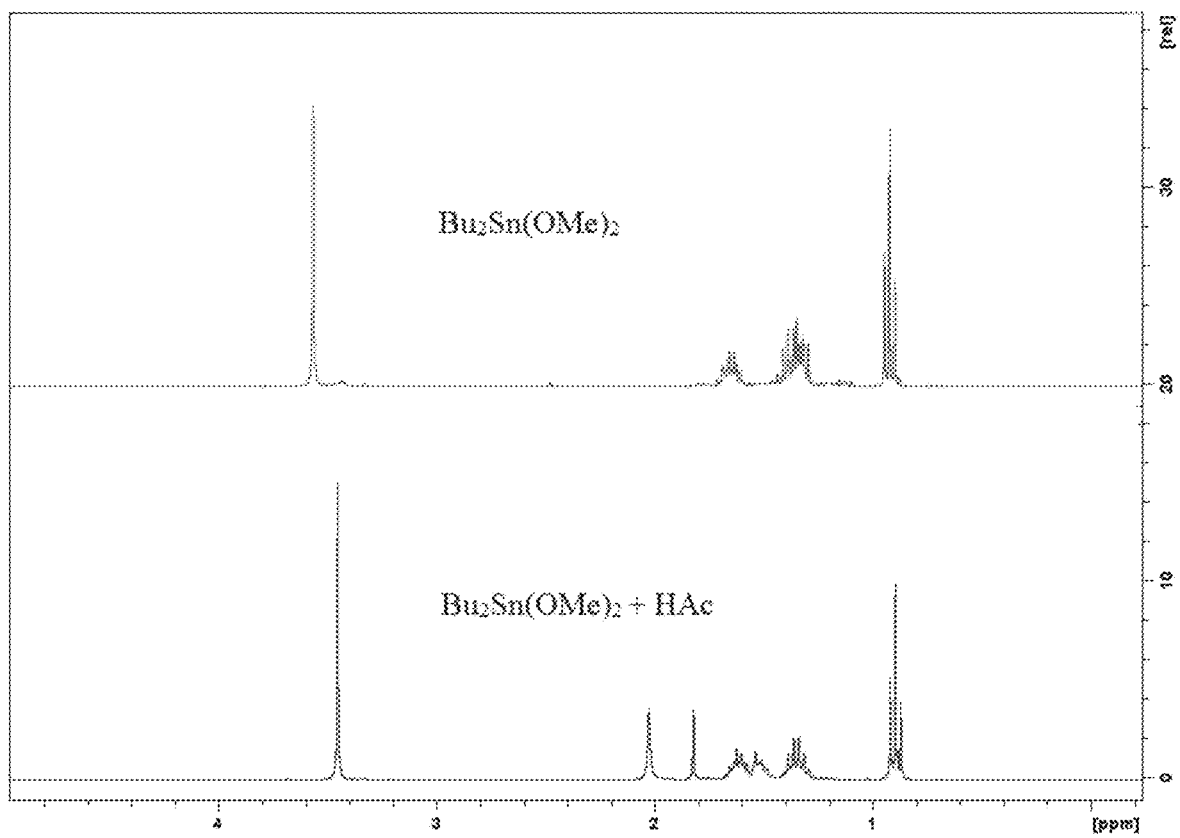
Figure 19. NMR of the reaction of $Bu_2Sn(OMe)_2$ with acetic acid.

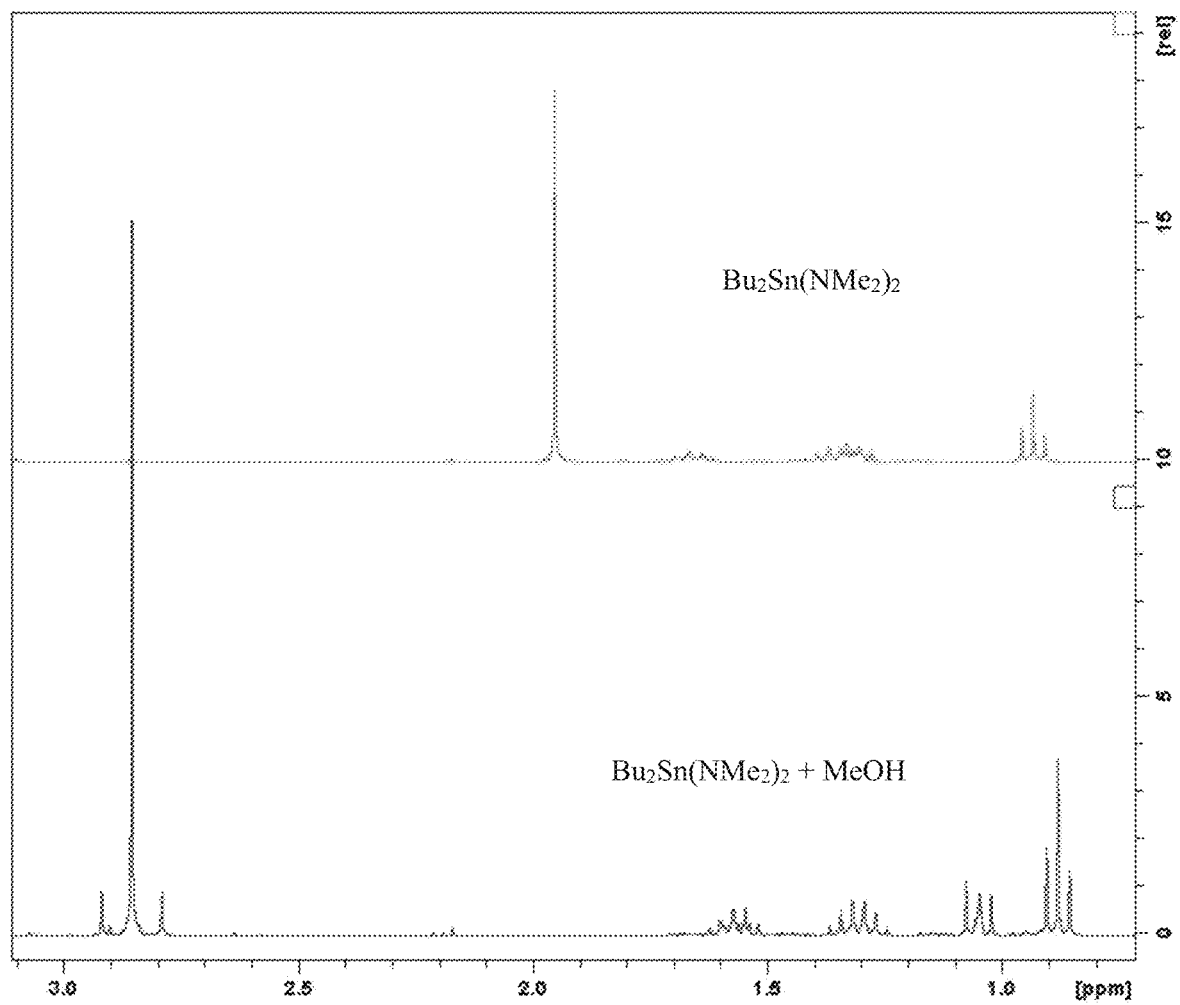
Figure 20. NMR of the reaction of $Bu_2Sn(NMe_2)_2$ with Methanol.

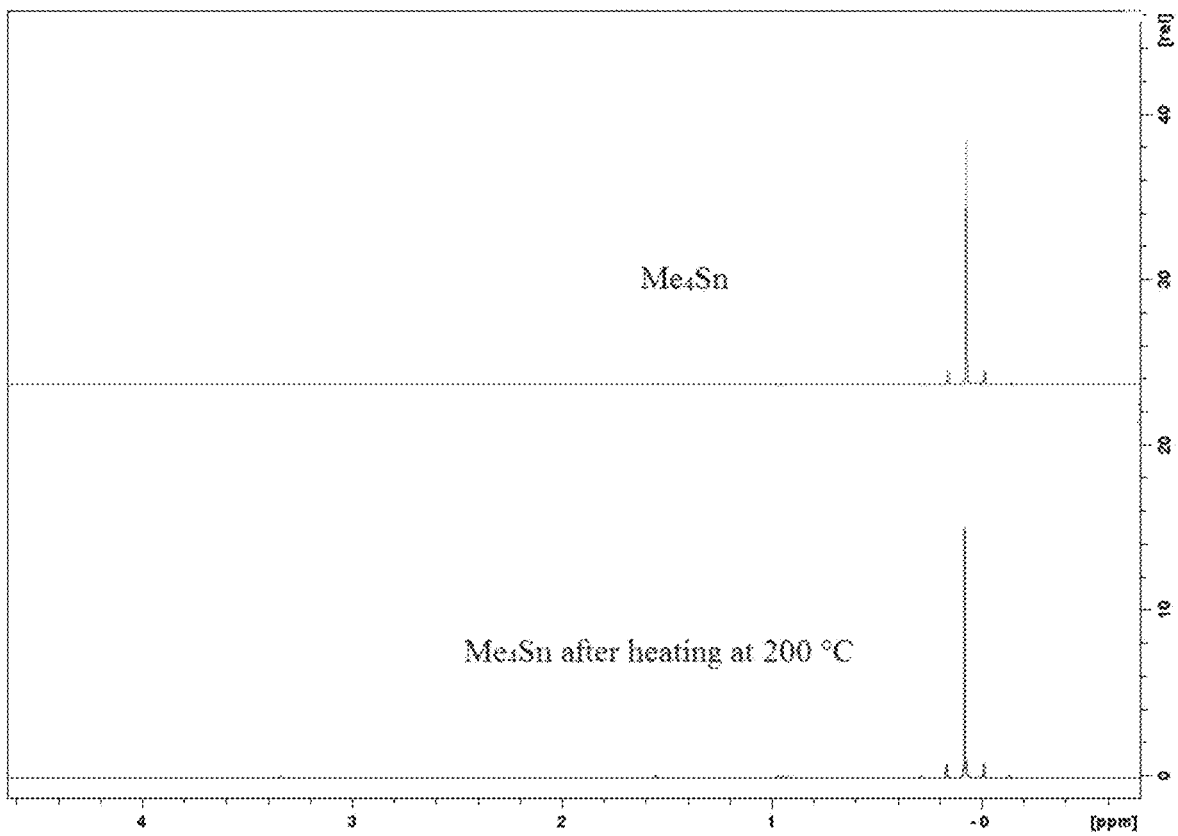
Figure 21. NMR of Me₄Sn before and after heating at 200 °C

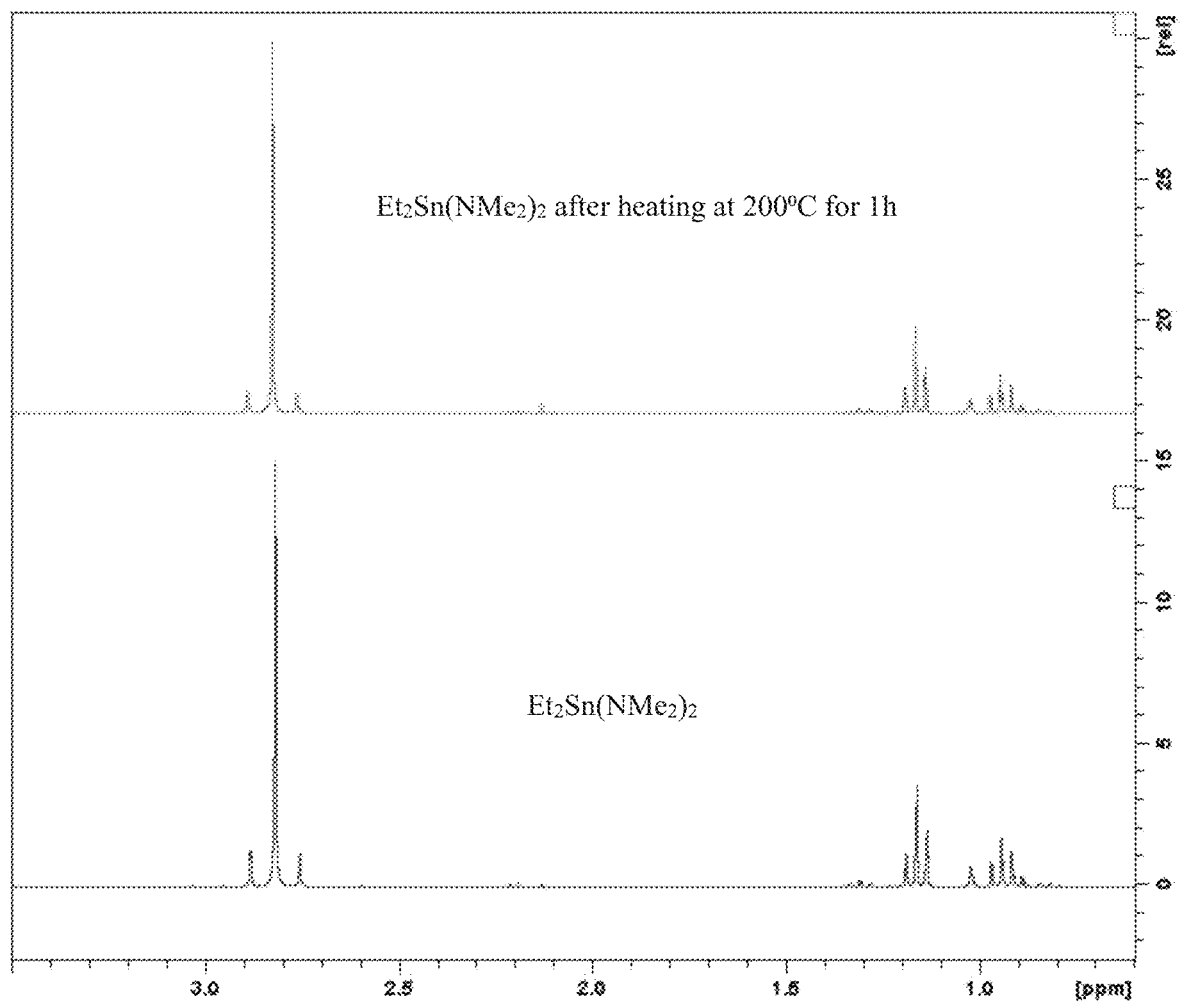
Figure 22. NMR of Et$_2$Sn(NMe$_2$)$_2$ before and after heating at 200 °C

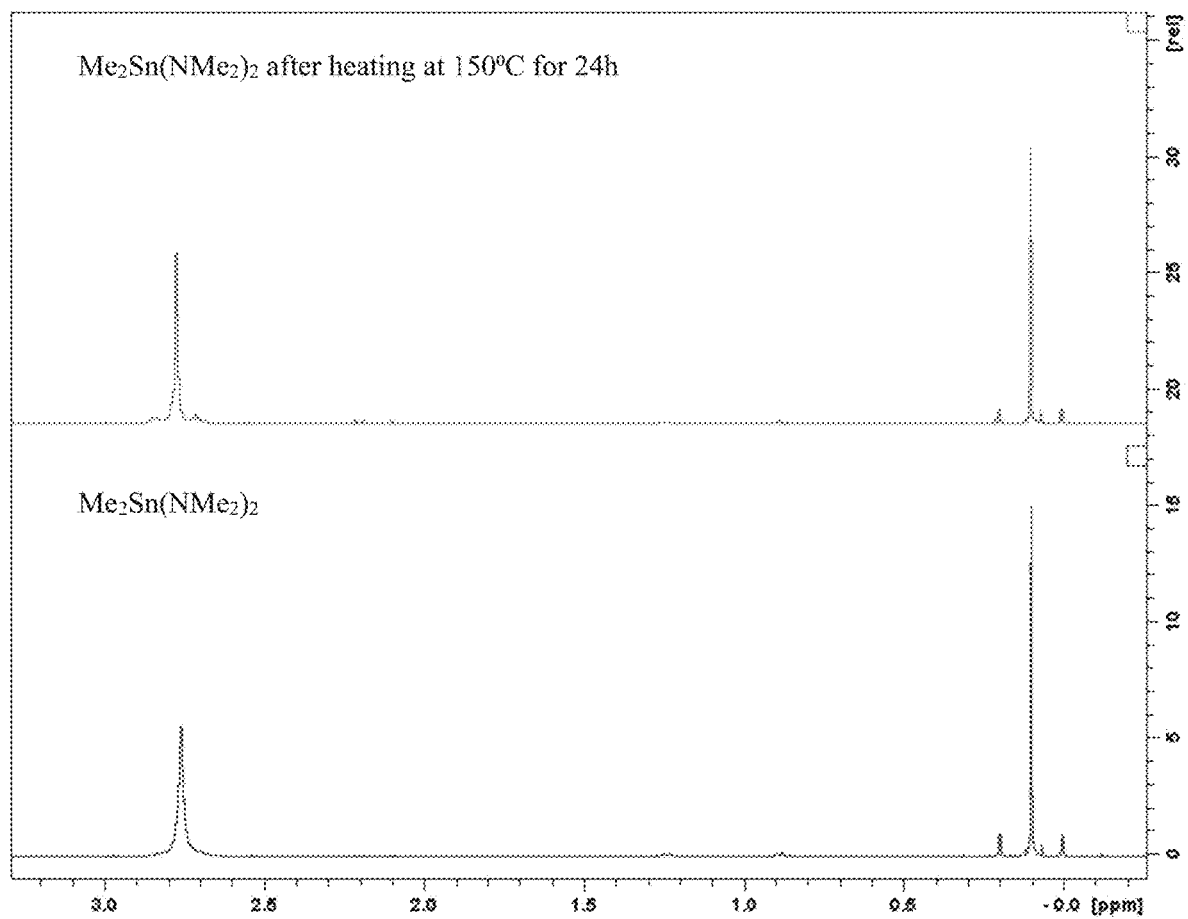
Figure 23. NMR of Me$_2$Sn(NMe$_2$)$_2$ before and after heating at 150 °C

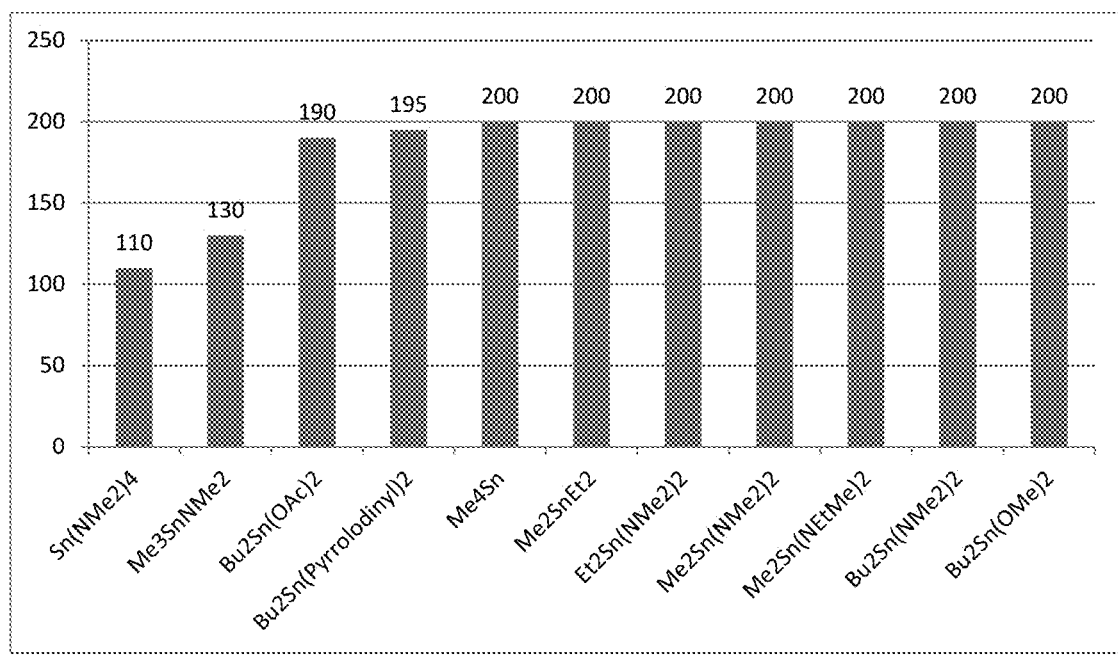
Figure 24. Decomposition temperature of illustrative compounds of Formula I.

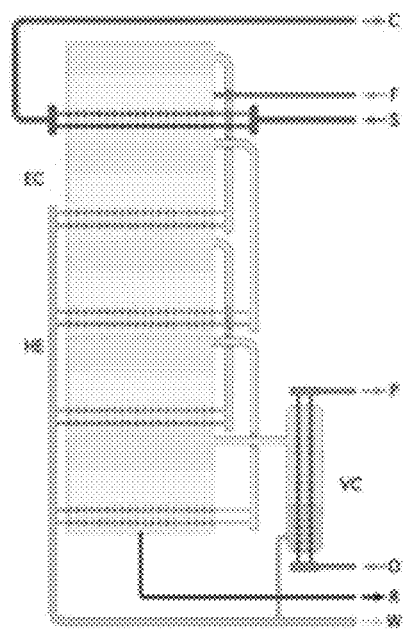
Schematic of a multiple effect desalination plant.
Figure 25. Multistage Distillation Example

ORGANOMETALLIC COMPOUNDS AND PURIFICATION OF SUCH ORGANOMETALLIC COMPOUNDS

CROSS REFERENCE TO RELATED APPLICATIONS

This application is a Divisional of copending application Ser. No. 16/442,930, filed Jun. 17, 2019, which is a Continuation of PCT International Patent Application No. PCT/CA2018/050933 filed Jul. 31, 2018, which claims priority to Canadian Application No. 2975104 filed Aug. 2, 2017, all of which are incorporated by reference in their entireties.

TECHNICAL FIELD

The disclosure relates to organometallic compounds useful for the deposition of high purity tin oxide and to the purification of such organometallic compounds.

BACKGROUND

The semiconductor industry is producing more and more components having smaller and smaller feature sizes. The production of such semiconductor devices reveals new design and manufacturing challenges which must be addressed in order to maintain or improve semiconductor device performance. The production of semiconductor wiring stacks with high density, high yield, good signal integrity as well as suitable power delivery also presents challenges.

Lithography is a critical pattern transfer technique widely used in the fabrication of a variety of electronic devices which contain microstructures, such as semiconductor devices and liquid crystal devices. As device structures are miniaturized, masking patterns used in the lithography process must be optimized to accurately transfer patterns to the underlying layers.

Multiple-pattern lithography represents a class of technologies developed for photolithography in order to enhance the feature density of semiconductor devices. Double-patterning, a subset of multiple-patterning, employs multiple masks and photolithographic steps to create a particular level of a semiconductor device. With benefits such as tighter pitches and narrower wires, double-patterning alters relationships between variables related to semiconductor device wiring and wire quality to sustain performance.

Recently, a liquid immersion lithography method has been reported, which purports to address some of the issues facing the industry. By employing liquid immersion lithography, a resist pattern having a higher resolution and an excellent depth of focus can be formed at a low cost, using a lens mounted on existing exposure systems, such that the liquid immersion lithography has attracted considerable attention.

As a result of moving to immersion lithography and multi-patterning, the need exists for a new class of conformally deposited materials to be deposited on top of photo resist, BARC, and other traditional masking layers. This new conformal deposition layer can serve 2 major functions:

1) It can act as a transparent protection layer (or "mask") to prevent chemical attack by the immersion lithography fluid. In this case, the conformal layer needs to be transparent, and be able to integrate with the lithography process without adverse patterning and exposure issues.
2) It can have a higher etch selectivity than prior art and traditional films such as amorphous carbon (which become more opaque with increasing thickness). For example, multi-patterning processes may require thicker (>10,000 Å), and therefore more opaque, amorphous carbon layers in order to achieve the necessary etch protection. To achieve a similar etch resistance, metal oxide conformal films can remain transparent while maintaining the required etch selectivity during the plasma etch process.

High purity of the reactant gases used in these processes are required, in order to ensure consistent chemical makeup for smoothness, etch and deposition characteristics, 100% step coverage/conformality requirement.

The purity of the film produced is also required to be high, due to the use of the film as a resist protection layer during etch or during litho immersion processing. Impurities in the film can have adverse reactions, chemically or optically, which interfere with the pattern quality and which can affect critical dimensions on the device features as well as these impurities leaching into or contaminating adjacent layers, which can result in degradation of the integrated device performance.

Conventional resist compositions cannot always be used in liquid immersion lithography processes, for a variety of reasons. For example, in the liquid immersion lithography process, the resist film is directly in contact with the refractive index liquid (immersion liquid) during the exposure, and hence the resist film is vulnerable to attack by the liquid. Resist compositions suitable for use in liquid immersion lithography processes must also be transparent to the exposure light. Further, conventional resist compositions may not be able to achieve a satisfactory resolution of pattern in liquid immersion lithography due to a change in their properties by the liquid, despite their utility in lithography employing the exposure through a layer of air.

Thus, there remains a need for improved transparent resist protection layers which can meet the increased requirements of the industry. Further, higher selectivity ALD films are needed for multi-patterning, as outlined above.

SUMMARY

Disclosed herein are compounds useful for the deposition of high purity tin oxide. Films deposited using such compounds demonstrate high conformality, high etch selectivity, high hardness and modulus, and are optically transparent.

Compounds include those of Formula I, below:

$$R_x\text{—Sn-}A_{4-x} \qquad \text{Formula I}$$

wherein:
  A is selected from the group consisting of $(Y_aR'_z)$ and a 3- to 7-membered N-containing heterocyclic group;
  each R group is independently selected from the group consisting of an alkyl or aryl group having from 1 to 10 carbon atoms;
  each R' group is independently selected from the group consisting of an alkyl, acyl or aryl group having from 1 to 10 carbon atoms;
  x is an integer from 0 to 4;
  a is an integer from 0 to 1;
  Y is selected from the group consisting of N, O, S, and P; and
  z is 1 when Y is O, S or when Y is absent and z is 2 when Y is N or P The use of compounds of Formula I allows for chemical vapour deposition (CVD) and atomic layer deposition (ALD) of tin oxide at a low temperature, and produces films consisting of high purity tin oxide having low metallic impurities, high hardness and modulus, and >99% step coverage (i.e. high conformality) over device features and topography.

Also disclosed is the purification of compounds of Formula I by multistage distillation. Such purification yields so-called "ultra-pure" compounds having higher assay purity and much lower levels of metallic impurities compared to compounds purified by conventional means. The use of such ultra-pure compounds in the processes disclosed herein results in films having improved properties compared to those known in the art. For example, the films may have improved hermetic properties, low impurities and improvements in the associated yield loss and long term reliability failures resulting from such impurities. Multistage distillation may be carried out in the form of packed columns, stage distillation columns employing trays, multiple distillation columns, or other types of multistage distillation.

The tin oxide film so produced may also exhibit high etch selectivity verses traditional masking and conformal layers used in multilayer patterning integration techniques, resulting in a thinner film requirement as compared to traditional films such as amorphous carbon, boron doped carbon, etc.

In an embodiment, in the organometallic compound of Formula I, A is selected from the group consisting of an (NR'2) group and a 3- to 7-membered N-containing heterocyclic group. In an embodiment, A is an (NR'2) group. In an embodiment, A is a 3- to 7-membered N-containing heterocyclic group. In an embodiment, A is a pyrrolidinyl group. In an embodiment, $A_{4-x}$ is $(NMe_2)_2$ or $(NEtMe)_2$.

In other embodiments R and R' group is an independently selected alkyl group having from 1 to 10 carbon atoms. It is contemplated that each R and R' group may be an independently selected alkyl group having from 1 to 6 carbon atoms. In embodiments, each R and R' group is an independently selected alkyl group having from 1 to 4 carbon atoms. In embodiments, R and R' is independently selected from the group consisting of methyl, ethyl, propyl, iso-propyl, tert-butyl, iso-butyl and n-butyl. In embodiments R and R' represent different alkyl groups.

In an embodiment, the compound of Formula I is selected from the group consisting of $Me_2Sn(NMe_2)_2$, $Me_2Sn(NEtMe)_2$, t-$BuSn(NEtMe)_3$, i-$PrSn(NEtMe)_3$, n-Pr$(NEtMe)_3$, $EtSN(NEtMe)_3$, i-$BuSn(NEtMe)_3$, $Et_2Sn(NEtMe)_2$, $Me_2Sn(NEtMe)_2$, $Sn(NEtMe)_4$, $Bu_2Sn(NEtMe)_2$, $Et_2Sn(NMe_2)_2$, $Me_2Sn(NEt_2)_2$, $Sn(Pyrrolidinyl)_4$ and $Bu_2Sn(Pyrrolidinyl)_2$.

In embodiments, the compound of Formula I is selected from the group consisting of $Me_2Sn(NMe_2)_2$, $Me_2Sn(NEtMe)_2$, $Et_2Sn(NMe_2)_2$, $Me_2Sn(NEt_2)_2$, $Sn(Pyrrolidinyl)_4$; and $Bu_2Sn(Pyrrolidinyl)_2$.

In embodiments, the compound of Formula I is selected from the group consisting of $Me_2Sn(NEtMe)_2$ and $Me_2Sn(NMe_2)_2$.

In embodiments, the compound of Formula I is $Me_2Sn(NMe_2)_2$.

In embodiments, a composition is provided that comprises the organometallic compound of any of the disclosed compounds and another organometallic compound containing Sn. The another organometallic compound may be a compound of Formula I.

In various embodiments, another organometallic compound is selected from the group consisting of $MeSn(NMe_2)_3$ and $Sn(NMe_2)_4$.

In an embodiment, a method of using multistage distillation to purify the organometallic compounds disclosed. In an embodiment, 2 to 20 stages are required to reduce metal contamination to <1 ppm. In an embodiment, 2 to 20 stages are required to reduce metal contamination to <100 ppb. In an embodiment, 2 to 20 stages are required to reduce metal contamination to <10 ppb. In an embodiment, 2 to 20 stages are required to reduce metal contamination to 1 ppb or less.

The foregoing and other features of the invention and advantages of the present invention will become more apparent in light of the following detailed description of the preferred embodiments, as illustrated in the accompanying figures. As will be realized, the invention is capable of modifications in various respects, all without departing from the invention. Accordingly, the drawings and the description are to be regarded as illustrative in nature, and not as restrictive

BRIEF DESCRIPTION OF THE DRAWINGS

FIG. 1 shows the NMR spectrum of $Me_3SnNMe_2$.
FIG. 2 shows the NMR spectrum of $Sn(NMe_2)_4$.
FIG. 3 shows the NMR spectrum of $Me_2Sn(NEtMe)_2$.
FIG. 4 shows the NMR spectrum of $Bu_2Sn(NMe_2)_2$.
FIG. 5 shows the NMR spectrum of $Me_2SnEt_2$.
FIG. 6 shows the NMR spectrum of $Me_4Sn$.
FIG. 7 shows the NMR spectrum of $Bu_2Sn(OMe)_2$.
FIG. 8 shows the NMR spectrum of $Bu_2Sn(OAc)_2$.
FIG. 9 shows the NMR spectrum of $Et_2Sn(NMe_2)_2$.
FIG. 10 shows the NMR spectrum of $Me_2Sn(NEt_2)_2$.
FIG. 11 shows the NMR spectrum of $Sn(Pyrrolodinyl)_4$.
FIG. 12 shows the NMR spectrum of $Bu_2Sn(Pyrrolodinyl)_2$.
FIG. 13 shows the NMR spectrum of $Et_2Sn(Pyrrolodinyl)_2$.
FIG. 14 shows the NMR spectrum of $Me_2Sn(NMe_2)_2$.
FIG. 15 shows the NMR spectrum of $tBuSn(NMe_2)_3$.
FIG. 16 shows the NMR of the reaction of $(NMe_2)_4Sn$ with ethanol.
FIG. 17 shows the NMR of the reaction of $Me_3SnNMe_2$ with water.
FIG. 18 shows the NMR of the reaction of $Bu_2Sn(OAc)_2$ with methanol.
FIG. 19 shows the NMR of the reaction of $Bu_2Sn(OMe)_2$ with acetic acid.
FIG. 20 shows the NMR of the reaction of $Bu_2Sn(NMe_2)_2$ with methanol.
FIG. 21 shows the NMR of $Me_4Sn$ before and after heating at 200° C.
FIG. 22 shows the NMR of $Et_2Sn(NMe_2)_2$ before and after heating at 200° C.
FIG. 23 shows the NMR of $Me_2Sn(NMe_2)_2$ before and after heating at 150° C.
FIG. 24 shows the decomposition temperatures of illustrative compounds of Formula I.
FIG. 25 shows a schematic of a multistage distillation apparatus.

DETAILED DESCRIPTION OF PARTICULAR EMBODIMENTS

Disclosed are organometallic compounds of Formula I, below:

$$R_x\text{—Sn-}A_{4-x} \qquad \text{Formula I}$$

wherein:
A is selected from the group consisting of $(Y_aR'_z)$ and a 3- to 7-membered N-containing heterocyclic group;
each R group is independently selected from the group consisting of an alkyl or aryl group having from 1 to 10 carbon atoms;

each R' group is independently selected from the group consisting of an alkyl, acyl or aryl group having from 1 to 10 carbon atoms;

x is an integer from 0 to 4;

a is an integer from 0 to 1;

Y is selected from the group consisting of N, O, S, and P; and z is 1 when Y is O, S or when Y is absent and z is 2 when Y is N or P Compounds of Formula I include those in which R is selected from the group consisting of alkyl and aryl groups having from 1 to 10 carbon atoms. Particular compounds are those in which R is selected from the group consisting of alkyl and aryl groups having from 1 to 6 carbon atoms. More particular are those in which R is selected from the group consisting of alkyl and aryl groups having from 1 to 4 carbon atoms. Examples of such compounds include those in which R is a methyl, ethyl or a butyl group.

Compounds of Formula I include those in which R' is selected from the group consisting of alkyl, acyl and aryl groups having from 1 to 10 carbon atoms. Particular compounds are those in which R' is selected from the group consisting of alkyl, acyl and aryl groups having from 1 to 6 carbon atoms. More particular are those in which R' is selected from the group consisting of alkyl, acyl and aryl groups having from 1 to 4 carbon atoms. Examples of such compounds include those in which R' is a methyl group, an ethyl group or an acetyl group.

Compounds of Formula I include those in which Y is selected from the group consisting of N, O, S, and P. Particular compounds are those in which Y is selected from the group consisting of N and O.

Compounds of Formula I include those in which x is an integer from 0 to 4. In particular embodiments, x is an integer from 1 to 3. More preferably, x is 2.

Compounds of Formula I include those in which A is a 3- to 7-membered N-containing heterocyclic group such as aziridinyl, pyrrolidinyl, and piperidinyl. Particular compounds are those in which A is a pyrrolidinyl or piperidinyl group.

Compounds of Formula I include those in which R is an alkyl group and A is an NR'$_2$ group, and wherein R' is an alkyl group. Particular compounds are those in which R and R' represent different alkyl groups.

Compounds of Formula I are thermally stable whilst exhibiting good reactivity. Thus, delivery of the compound to the deposition chamber will take place without decomposition occurring. (decomposition results in a deposited film which will not be uniform). A good stability and reactivity profile, as demonstrated by the compounds of the invention, also means that less material is required to be delivered to the growth chamber (less material is more economic), and cycling will be faster (as there will be less material left in the chamber at the end of the process to be pumped off), meaning that thicker films can be deposited in shorter times, so increasing throughput. Further, ALD can be carried out at much lower temperatures (or using a wider temperature window) using compounds of Formula I than processes of the art. Thermal stability also means that material can be purified much more easily after synthesis, and handling becomes easier.

Such compounds are useful for encapsulating and protecting the resist layers used in liquid immersion lithography (i.e. acting as a "mask"). Thus, the compounds disclosed herein may be used for the manufacture of a transparent tin oxide film having properties suitable for deposition over photoresists, or other organic masking layers, to allow for protection of the underlying layer during liquid immersion lithography, and which permits the manufacture of devices having improved semiconductor device performance such as low defect density, improved device reliability, high device density, high yield, good signal integrity and suitable power delivery, as required by the industry.

Further, the use of a compound of Formula I in the methods disclosed herein allows for chemical vapour deposition (CVD) and atomic layer deposition (ALD) of tin oxide at a low temperature, and produces films consisting of high purity tin oxide having low metallic impurities, and >99% step coverage (i.e. high comformality) over device features and topography.

Compounds of Formula I may be prepared by processes known in the art. The examples below are illustrative of such processes, but are not intended to be limiting.

Example 1: Synthesis of Me$_3$Sn(NMe$_2$)

In a 250 mL flask was charged 20 mL of 2.5M Butyllithium solution in hexane and 50 mL of anhydrous hexane. To the solution, Me$_2$NH gas was passed till fully reacted and the reaction mixture was stirred for 2 hrs. The solution of 10 g of Me$_3$SnCl in 100 mL of anhydrous hexane was then added and the mixture was stirred for 12 hrs. Filtration was carried out to remove solid. The solvent was removed under reduced pressure. The liquid product was purified by distillation under reduced pressure. NMR confirmed the product to be Me$_3$SnNMe$_2$, as shown in FIG. 1.

Example 2: Synthesis of Sn(NMe$_2$)$_4$

In a 250 mL flask was charged 80 mL of 2.5M Butyllithium solution in hexane and 50 mL of anhydrous hexane. To the solution, Me$_2$NH gas was passed till fully reacted and the reaction mixture was stirred for 2 hrs. The solution of 13 g of SnCl$_4$ in 100 mL of anhydrous benzene was then added and the mixture was refluxed for 4 hrs. Once cooled, filtration was carried out to remove solid. The solvent was removed under reduced pressure. The liquid product was purified by distillation under reduced pressure. NMR confirmed the product to be Sn(NMe$_2$)$_4$, as shown in FIG. 2.

Example 3: Synthesis of Me$_2$Sn(NEtMe)$_2$

Under inert atmosphere, a 1 L round bottom flask was charged with 25.00 mL of 2.5M Butyllithium solution in hexane and 200 mL of anhydrous hexane, followed by a slow addition of 5.40 mL of HNEtMe in 100 mL of anhydrous hexane. The reaction mixture was then stirred at room temperature for 1 h. The solution of 6.70 g of Me$_2$SnCl$_2$ in 200 mL of anhydrous benzene was then added to the flask (while cooled in the ice bath), and the reaction mixture was left stirring at room temperature overnight. The solvent was removed under reduced pressure from the filtrate. The liquid product was isolated by distillation under reduced pressure (80° C. at 9.8×10$^{-2}$ Torr). As shown in FIG. 3, the product was confirmed to be Me$_2$Sn(NEtMe)$_2$ by NMR spectroscopy.

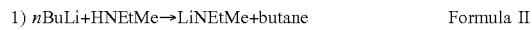

1) $n$BuLi+HNEtMe→LiNEtMe+butane      Formula II

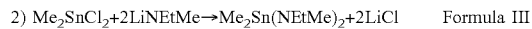

2) Me$_2$SnCl$_2$+2LiNEtMe→Me$_2$Sn(NEtMe)$_2$+2LiCl      Formula III

Example 4: Synthesis of Bu$_2$Sn(NMe$_2$)$_2$

In a 250 mL flask was charged 24 mL of 2.5M Butyllithium solution in hexane and 100 mL of anhydrous hexane.

To the solution, Me$_2$NH gas was passed till fully reacted and the reaction mixture was stirred for 2 hrs. The solution of 9.11 g of Bu$_2$SnCl$_2$ in 100 mL of anhydrous benzene was then added and the mixture was stirred for 4 hrs. Filtration was carried out to remove solid. The solvent was removed under reduced pressure. The liquid product was purified by distillation under reduced pressure. NMR confirmed the product to be Bu$_2$Sn(NMe$_2$)$_2$, as shown in FIG. 4.

Example 5: Synthesis of Me$_2$SnEt$_2$ 6.59 g of Me$_2$SnCl$_2$ was dissolved in 100 mL of anhydrous ether, followed by the addition of 30 mL of 3M EtMgBr under N$_2$. After stirring for 4 hrs, mixture was treated with 0.1M HCl solution and organic layer was collected. The collected organic layer was then treated with saturated NaHCO$_3$ solution and organic layer is collected. Distillation under N$_2$ was carried out to remove ether. Purification was carried out by distillation under reduced pressure. As shown in FIG. 5, NMR confirmed the product to be Me$_2$SnEt$_2$.

Example 6: Synthesis of Me$_4$Sn

To the solution of 23.5 g of SnCl$_4$ in ether was added 150 mL of 3M MeMgI under N$_2$. After stirring for 4 hrs, mixture was treated with 0.1 M HCl solution and organic layer was collected. The collected organic layer was then treated with saturated NaHCO$_3$ solution and organic layer is collected. Fractional distillation was carried out to remove ether. Purification was carried out by distillation under reduced pressure. As shown in FIG. 6, NMR confirmed the product to be Me$_4$Sn.

Example 7: Synthesis of Bu$_2$Sn(OMe)$_2$

To a 250 mL flask was charged 20 g of Bu$_2$SnCl$_2$ and 20 mL of anhydrous methanol, followed by the addition of 7 g of sodium methoxide in 30 mL of anhydrous methanol. The resulting mixture was refluxed for 12 hrs. Filtration was carried out to remove solid. The solvent was removed under reduced pressure. The liquid product was purified by distillation under reduced pressure. As shown in FIG. 7, NMR confirmed the product to be Bu$_2$Sn(OMe)$_2$.

Example 8: Synthesis of Bu$_2$Sn(OAc)$_2$

Sodium acetate was first made by adding 6 g acetic acid into a solution of 5.4 g of sodium methoxide in 30 mL of anhydrous methanol. This was then added into the mixture of 30 g of Bu$_2$SnCl$_2$ in 30 mL of anhydrous methanol. The resulting mixture was refluxed for 4 hrs. Filtration was carried out to remove solid. The solvent was removed under reduced pressure. The liquid product was purified by distillation under reduced pressure. As shown in FIG. 8, NMR confirmed the product to be Bu$_2$Sn(OAc)$_2$.

Example 9: Synthesis of Et$_2$Sn(NMe$_2$)$_2$

A 1 L flask was charged with 22 mL of 2.5M Butyllithium solution in hexane and 400 mL of anhydrous hexane. Me$_2$NH gas was passed through the solution, and the reaction mixture was stirred for 1 h. The solution of 6.71 g of Et$_2$SnCl$_2$ in 100 mL of anhydrous benzene was then added and the mixture was stirred for 4 hrs. Filtration was carried out to remove any solid products. The solvent was removed under reduced pressure from the filtrate. The liquid product was purified by distillation under reduced pressure. As shown in FIG. 9, NMR confirmed the product to be Et$_2$Sn(NMe$_2$)$_2$.

Example 10: Synthesis of Me$_2$Sn(NEt$_2$)$_2$

In a 250 mL flask was charged 24 mL of 2.5M Butyllithium solution in hexane and 50 mL of anhydrous hexane, followed by the addition of 4.39 g of Et$_2$NH. The reaction mixture was stirred for 2 hrs. The solution of 6.59 g of Me$_2$SnCl$_2$ in 100 mL of anhydrous ether was then added and the mixture was stirred for 4 hrs. Filtration was carried out to remove solid. The solvent was removed under reduced pressure. The liquid product was purified by distillation under reduced pressure. As shown in FIG. 10, NMR confirmed the product to be Me$_2$Sn(NEt$_2$)$_2$.

Example 11: Synthesis of Sn(Pyrrolidinyl)$_4$

Under inert atmosphere, a 100 mL round bottom flask was charged with 0.5 mL of Sn(NMe$_2$)$_4$ and 25 mL of anhydrous hexane, followed by a drop-wise addition of 1.1 mL of pyrrolidene. After stirring the reaction mixture at room temperature for 2 h, the solvent was removed via distillation under reduced pressure. The residue remaining in the reaction flask was confirmed to be Sn(Pyrrolodinyl)$_4$ by NMR spectroscopy, as shown in FIG. 11.

Example 12: Synthesis of Bu$_2$Sn(Pyrrolodinyl)$_2$

Under inert atmosphere, a 1 L round bottom flask was charged with 25 mL of 2.5M Butyllithium solution in hexane and 200 mL of anhydrous hexane, followed by a slow addition of 5.3 mL of pyrrolidene in 25 mL of anhydrous hexane. The reaction mixture was then stirred at room temperature for 1 h, and then placed into the ice bath. The solution of 9.46 g of Bu$_2$SnCl$_2$ in 50 mL of anhydrous hexane was then added to the flask, and the reaction mixture was left stirring at room temperature for 2 h. Filtration was carried out to remove any solid products. The solvent was removed under reduced pressure from the filtrate. As shown in FIG. 12, the product was confirmed to be Bu$_2$Sn(Pyrrolodinyl)$_2$ by NMR spectroscopy.

Example 13: Synthesis of Et$_2$Sn(Pyrrolodinyl)$_2$

Under inert atmosphere, a 1 L round bottom flask was charged with 5.3 mL of pyrrolidene and 200 mL of anhydrous pentane. Once the reaction flask was placed in the ice bath, 25 mL of 2.5M Butyllithium solution in hexane were slowly added to the reaction flask while stirring vigorously. The reaction mixture was then stirred at room temperature for 1 h, and then placed back into the ice bath. The solution of 7.7 g of Et$_2$SnCl$_2$ in 100 mL of anhydrous pentane and 20 mL of anhydrous benzene was then added to the flask, and the reaction mixture was left stirring at room temperature overnight. Filtration was carried out to remove any solid products. The solvent was removed under reduced pressure from the filtrate. Final product was purified via vacuum distillation. As shown in FIG. 13, the product is confirmed to be Et$_2$Sn(Pyrrolodinyl)$_2$ by NMR spectroscopy.

Example 14: Synthesis of Me$_2$Sn(NMe$_2$)$_2$

Under inert atmosphere, a 1 L flask was charged with 25 mL of 2.5M Butyllithium solution in hexane and 400 mL of anhydrous hexane. The reaction flask was placed in the ice bath and Me$_2$NH gas was passed through the solution until a white slushy solution was obtained (ca. 15 min). Afterwards the reaction mixture was stirred for 1 h at room temperature. The reaction flask was placed in the ice bath again and the solution of 6.7 g of Me$_2$SnCl$_2$ in 100 mL of anhydrous benzene was slowly added, and the mixture was stirred overnight at room temperature. Filtration was carried out to remove any solid products. The solvent was removed under reduced pressure from the filtrate. The liquid product was purified by distillation under reduced pressure. As shown in FIG. 14, the product is confirmed to be Me$_2$Sn(NMe$_2$)$_2$ by NMR spectroscopy.

Example 15: Synthesis of tBuSn(NMe$_2$)$_3$

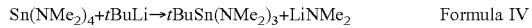

Sn(NMe$_2$)$_4$+tBuLi→tBuSn(NMe$_2$)$_3$+LiNMe$_2$       Formula IV

Under inert atmosphere, a 5 L round bottom flask was charged with 100 mL of Sn(NMe$_2$)$_4$ and ca. 3 L of anhydrous hexane. The mixture was stirred using a mechanical stirrer, and placed in the ethylene-glycol bath at −15° C. In the glovebox, a 1 L flask was loaded with 200 mL of 1.7M tert-butyllithium solution in anhydrous hexane, and ca. 200 mL of anhydrous hexane. The tBuLi solution was then slowly added to the reaction flask. The reaction mixture was stirred at room temperature for 3 h. The stirring was then stopped, and salts were left to precipitate out of the reaction mixture overnight. The liquid was cannulated into another 5 L round bottom flask. The solvents were removed via distillation, and 62 g of the final product were isolated by distillation under reduced pressure (120° C., 6.2×10$^{-2}$ Torr). As shown in FIG. 15, the product was confirmed to be tBuSn(NMe$_2$)$_3$ by NMR spectroscopy. 90% tBuSn(NMe$_2$)$_3$ and 10% tBu$_2$Sn(NMe$_2$)$_2$.

Similarly, complexes of the type RSn(NEtMe)$_3$ can be synthesized following the above procedure by reacting Sn(NEtMe)$_4$ with RLi, where R=Et, iPr, iBu, nPr Sn(NEtMe)$_4$+RLi→RSn(NEtMe)$_3$+LiNEtMe       Formula V where R=Et, iPr, iBu, nPr Example 16: Sn(NEtMe)$_4$+EtLi→EtSn(NEtMe)$_3$+LiNEtMe Under inert atmosphere, a 5 L round bottom flask was charged with 100 g of Sn(NEtMe)$_4$ and ca. 2.5 L of anhydrous hexane. The mixture was stirred using a mechanical stirrer, and placed in the ethylene-glycol bath at −15° C. In the glovebox, a 1 L flask was loaded with 655 mL of 0.5 M ethyllithium solution in anhydrous benzene, and ca. 200 mL of anhydrous benzene. The EtLi solution was then slowly added to the reaction flask. The reaction mixture was stirred at room temperature for 3 h. The stirring was then stopped, and salts were left to precipitate out of the reaction mixture overnight. The liquid was cannulated into another 5 L round bottom flask. The solvents were removed via distillation, and the final product isolated via distillation under reduced pressure.

Example 17: Sn(NEtMe)$_4$+iPrLi→iPrSn(NEtMe)$_3$+LiNEtMe

Under inert atmosphere, a 5 L round bottom flask was charged with 100 g of Sn(NEtMe)$_4$ and ca. 2.5 L of anhydrous hexane. The mixture was stirred using a mechanical stirrer, and placed in the ethylene-glycol bath at −15° C. In the glovebox, a 1 L flask was loaded with 468 mL of 0.7 M isopropyllithium solution in anhydrous pentane, and ca. 200 mL of anhydrous hexane. The iPrLi solution was then slowly added to the reaction flask. The reaction mixture was stirred at room temperature for 3 h. The stirring was then stopped, and salts were left to precipitate out of the reaction mixture overnight. The liquid was cannulated into another 5 L round bottom flask. The solvents were removed via distillation, and the final product isolated via distillation under reduced pressure.

Example 18: Sn(NEtMe)$_4$+iBuLi→iBuSn(NEtMe)$_3$+LiNEtMe

Under inert atmosphere, a 5 L round bottom flask was charged with 100 g of Sn(NEtMe)$_4$ and ca. 3 L of anhydrous hexane. The mixture was stirred using a mechanical stirrer, and placed in the ethylene-glycol bath at −15° C. In the glovebox, a 1 L flask was loaded with 193 mL of 1.7 M isobutyllithium solution in anhydrous heptane, and ca. 200 mL of anhydrous hexane. The iBuLi solution was then slowly added to the reaction flask. The reaction mixture was stirred at room temperature for 3 h. The stirring was then stopped, and salts were left to precipitate out of the reaction mixture overnight. The liquid was cannulated into another 5 L round bottom flask. The solvents were removed via distillation, and the final product isolated via distillation under reduced pressure.

Example 19: Sn(NEtMe)$_4$+nPrLi→nPrSn(NEtMe)$_3$+LiNEtMe

Under inert atmosphere, a 5 L round bottom flask was charged with 100 g of Sn(NEtMe)$_4$ and ca. 3 L of anhydrous hexane. The mixture was stirred using a mechanical stirrer, and placed in the ethylene-glycol bath at −15° C. In the glovebox, a 1 L flask was loaded with 193 mL of 1.7 M n-propyllithium solution in anhydrous heptane, and ca. 200 mL of anhydrous hexane. The nPrLi solution was then slowly added to the reaction flask. The reaction mixture was stirred at room temperature for 3 h. The stirring was then stopped, and salts were left to precipitate out of the reaction mixture overnight. The liquid was cannulated into another 5 L round bottom flask. The solvents were removed via distillation, and the final product isolated via distillation under reduced pressure.

Example 20: Comparative Reactivity Tests

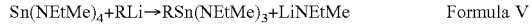

a)
  To Sn(NMe$_2$)$_4$ was added water. Reaction took place spontaneously. The clear Sn(NMe$_2$)$_4$ turned cloudy and a white solid formed.
  To Sn(NMe$_2$)$_4$ was added anhydrous ethanol. The mixture warmed up and NMR confirmed the complete replacement of —NMe$_2$ group by —OEt group. More ethanol was added and NMR was carried out to further confirm the completion of the reaction (FIG. 16).
b)
  To Me$_3$SnNMe$_2$ was added water. NMR indicated that no reaction took place. The mixture was heated at 50° C. for 1 hr. NMR showed that reaction took place (FIG. 17).
  To Me$_3$SnNMe$_2$ was added anhydrous methanol NMR indicated that no reaction took place. The mixture was heated at 50° C. for 1 hr. The clear solution turned cloudy. NMR confirmed that reaction had taken place.

c)
  To $Bu_2Sn(OAc)_2$ was added water. Reaction took place spontaneously. The clear $Bu_2Sn(OAc)_2$ turned cloudy and a white solid formed.
  To $Bu_2Sn(OAc)_2$ was added anhydrous methanol. NMR showed that no reaction took place (FIG. 18).
d)
  To $Bu_2Sn(OMe)_2$ was added water. Reaction took place spontaneously. The clear $Bu_2Sn(OMe)_2$ turned cloudy and a white solid formed.
  To $Bu_2Sn(OMe)_2$ was added acetic acid. NMR shows that some —OMe group has been replaced by —OAc group (FIG. 19).
e)
  To $Bu_2Sn(NMe_2)_2$ was added water. Reaction took place spontaneously. The clear $Bu_2Sn(NMe_2)_2$ turned cloudy and a white solid formed.
  To $Bu_2Sn(NMe_2)_2$ was added Methanol. NMR shows that some —$NMe_2$ group has been replaced by —OMe group (FIG. 20).

Example 21: Thermal Stability Tests

Thermal stability tests of compounds of Formula I were carried out in sealed glass ampoules, which were heated at a set temperature for 1 hr. NMR was performed to see if there had been any thermal decomposition. A visual check was also used, looking for solid formation after heat treatment. FIG. 21 shows NMR of $Me_4Sn$ before and after heating at 200° C. There was no significant change after heating at 200° C. for 1 hr based on both NMR and visual check.

FIG. 22 shows NMR of $Et_2Sn(NMe_2)_2$ before and after heating at 200° C. There was no significant change after heating at 200° C. for 1 hr based on both NMR and visual check.

FIG. 23 shows NMR of $Me_2Sn(NMe_2)_2$ before and after heating at 150° C. There was no significant change after heating at 150° C. for 24 hr based on both NMR and visual check.

FIG. 24 shows the decomposition temperature of representative compounds of Formula I.

These results demonstrate that compounds of Formula I are thermally stable, showing that delivery of the compound to the deposition chamber will take place without observable decomposition occurring.

Multistage Distillation

Various forms of multistage distillation are known in the chemical manufacturing industry, but have not been employed for the purification of organometallic materials that include tetramethyl tin or other compounds of Formula I.

As illustrated by the schematic shown in FIG. 25, multiple-effect or multistage distillation (MED) is a distillation process often used for sea water desalination. It consists of multiple stages or "effects". (In schematic in FIG. 25 the first stage is at the top. Pink areas are vapor, lighter blue areas are liquid feed material. The turquoise represents condensate. It is not shown how feed material enters other stages than the first, however those should be readily understood. F—feed in. S—heating steam in. C—heating steam out. W—purified material (condensate) out. R—waste material out. O—coolant in. P—coolant out. VC is the last-stage cooler.) In each stage the feed material is heated by steam in tubes. Some of the feed material evaporates, and this steam flows into the tubes of the next stage, heating and evaporating more of the distillate. Each stage essentially reuses the energy from the previous stage.

The plant can be seen as a sequence of closed spaces separated by tube walls, with a heat source at one end and a heat sink at the other. Each space consists of two communicating subspaces, the exterior of the tubes of stage n and the interior of the tubes in stage n+1. Each space has a lower temperature and pressure than the previous space, and the tube walls have intermediate temperatures between the temperatures of the fluids on each side. The pressure in a space cannot be in equilibrium with the temperatures of the walls of both subspaces; it has an intermediate pressure. As a result, the pressure is too low or the temperature too high in the first subspace, and the feed material evaporates. In the second subspace, the pressure is too high or the temperature too low, and the vapor condenses. This carries evaporation energy from the warmer first subspace to the colder second subspace. At the second subspace the energy flows by conduction through the tube walls to the colder next space.

As shown by Table 2 below, purification of $SnMe_4$ by multistage distillation results in a compound having significantly lower levels of impurities compared to that purified by conventional means.

TABLE 2

| Element | Multistage ppb | Single stage option 1 ppb | Single stage option 2 ppb | Average single stage ppb | Delta Multi vs Single ppb % difference |
| --- | --- | --- | --- | --- | --- |
| Ag | 5 | 10 | 5 | 7.5 | −33% |
| Al | 5 | 40 | 20 | 30 | −83% |
| As | 50 | 50 | 100 | 75 | −33% |
| Au | 10 | 10 | 5 | 7.5 | 33% |
| B | 40 | 70 | 10 | 40 | 0% |
| Be | 1 | 1 | 5 | 3 | −67% |
| Bi | 1 | 2 | 5 | 3.5 | −71% |
| Ca | 80 | 270 | 100 | 185 | −57% |
| Cd | 1 | 1 | 5 | 3 | −67% |
| Co | 0 | 1 | 5 | 3 | −100% |
| Cr | 2 | 3 | 5 | 4 | −50% |
| Cu | 4 | 12 | 5 | 8.5 | −53% |
| Fe | 11 | 31 | 10 | 20.5 | −46% |
| Hf | 0 | 0 | 5 | 2.5 | −100% |
| K | 30 | 30 | 20 | 25 | 20% |
| Li | 2 | 5 | 50 | 27.5 | −93% |
| Mg | 8 | 35 | 50 | 42.5 | −81% |
| Mn | 0.5 | 0.5 | 5 | 2.75 | −82% |
| Mo | 0.5 | 1.8 | 5 | 3.4 | −85% |
| Na | 200 | 200 | 100 | 150 | 33% |
| Nb | 0.5 | 0.5 | 5 | 2.75 | −82% |
| N | 150 | 150 | 5 | 77.5 | 94% |
| Pb | 0.4 | 2.1 | 2 | 2.05 | −80% |
| Pd | 0.5 | 0.5 | 5 | 2.75 | −82% |
| Pt | 2 | 2 | 5 | 3.5 | −43% |
| Rb | 1 | 1 | 5 | 3 | −67% |
| Re | 0.5 | 0.5 | 5 | 2.75 | −82% |
| Rh | 0.5 | 0.5 | 5 | 2.75 | −82% |
| Ru | 0.5 | 0.5 | 5 | 2.75 | −82% |
| Sb | 20 | 120 | 250 | 185 | −89% |

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed. The various embodiments and elements can be interchanged or combined in any suitable manner as necessary.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

The invention claimed is:

1. A method purifying an organometallic compound comprising:

A) distilling in a first stage an organometallic compound of Formula 1:

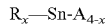 Formula I wherein:
each R group is independently selected from the group consisting of an alkyl group having from 1 to 10 carbon atoms;
each R' group is independently selected from the group consisting of an alkyl group having from 1 to 10 carbon atoms;
x is an integer from 0 to 3;
wherein distilling in the first stage includes:
i) feeding feed material containing the first organometallic compound to a first distillation space at a reduced first pressure,
ii) heating the first distillation space to a first temperature to evaporate a portion of the feed material, and
iii) removing the evaporated portion of the feed material from the first distillation space such that a distillate is formed;
B) distilling, in at least one subsequent stage, the distillate from a previous stage,
wherein distilling the distillate from a previous stage includes:
i) feeding distillate from a previous stage to a subsequent distillation space at a reduced subsequent pressure,
ii) heating the subsequent distillation space to a subsequent temperature to evaporate a portion of the distillate from a previous stage,
iii) removing the evaporated portion of the distillate from a previous stage from the subsequent distillation space such that a subsequent distillate is formed; and C) removing a final distillate from last of the subsequent stages, wherein step B is repeated a number of times at a reduced subsequent pressure sufficient to obtain the final distillate of the organometallic compound having purity as measured by nuclear magnetic resonance (NMR) spectroscopy of greater than 98%.

2. The method of claim 1, wherein step B is repeated 1 to 19 times.

3. The method of claim 1, wherein, in each subsequent stage, the distillation space has a subsequent pressure that is lower than a subsequent pressure in a previous stage.

4. The method of claim 3, wherein, in each subsequent stage, a subsequent temperature is lower than a subsequent temperature in a previous stage.

5. The method of claim 1, wherein, in each stage, the heating step is by steam in tubes and, in each subsequent stage, steam in the tubes is the evaporated portion of the feed material or distillate from a previous stage.

6. The method of claim 1, wherein each R group is an independently selected alkyl group having from 1 to 4 carbon atoms.

7. The method of claim 1, wherein each R' group represents different alkyl groups.

8. The method of claim 1, wherein the organometallic compound of Formula I is selected from the group consisting of Me$_2$Sn(NMe$_2$)$_2$, Me$_2$Sn(NEtMe)$_2$, t-BuSn(NEtMe)$_3$, t-BuSn(NMe$_2$)$_3$, t-BuSn(NEt$_2$)$_3$, i-PrSn(NEtMe)$_3$, i-PrSn(NEtMe$_2$)$_3$, n-PrSn(NEtMe)$_3$, n-PrSn(NEtMe$_2$)$_3$, EtSn(NEtMe)$_3$, i-BuSn(NEtMe)$_3$, i-BuSn(NEtMe$_2$)$_3$, n-BuSn(NMe$_2$)$_3$, sec-BuSn(NMe$_2$)$_3$, Et$_2$Sn(NEtMe)$_2$, Me$_2$Sn(NEtMe)$_2$, Sn(NMe$_2$)$_4$, Sn(NEt$_2$)$_4$, Sn(NEtMe)$_4$, Bu$_2$Sn(NEtMe)$_2$, and Me$_2$Sn(NEt$_2$)$_2$.

9. The method of claim 8, wherein the organometallic compound of Formula I is Sn(NMe$_2$)$_4$.

10. The method of claim 1, wherein at least one of the reduced first pressure and the reduced subsequent pressure are less than $10^{-1}$ torr.

11. A method purifying an organometallic compound comprising:

A) distilling in a first stage an organometallic compound of Formula 1:

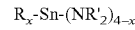 Formula I wherein:
each R group is independently selected from the group consisting of an alkyl group having from 1 to 10 carbon atoms;
each R' group is independently selected from the group consisting of an alkyl group having from 1 to 10 carbon atoms;
x is an integer from 0 to 3;
wherein distilling in the first stage includes:
i) feeding feed material containing the first organometallic compound to a first distillation space at a reduced first pressure,
ii) heating the first distillation space to a first temperature to evaporate a portion of the feed material, and
iii) removing the evaporated portion of the feed material from the first distillation space such that a distillate is formed;
B) distilling, in at least one subsequent stage, the distillate from a previous stage,
wherein distilling the distillate from a previous stage includes:
i) feeding distillate from a previous stage to a subsequent distillation space at a reduced subsequent pressure, ii) heating the subsequent distillation space to a subsequent temperature to evaporate a portion of the distillate from a previous stage, iii) removing the evaporated portion of the distillate from a previous stage from the subsequent distillation space such that a subsequent distillate is formed; and C) removing a final distillate from last of the subsequent stages, wherein step B is repeated a number of times at a reduced subsequent pressure sufficient to obtain the final distillate of the organometallic compound having a metal contamination of less than 1 ppm.

12. The method of claim 11, wherein step B is repeated a number of times sufficient to reduce metal contamination to less than 100ppb.

13. The method of claim 12, wherein step B is repeated a number of times sufficient to reduce metal contamination to 1ppb or less.

14. The method of claim 11, wherein step B is repeated 1 to 19 times.

15. The method of claim 11, wherein, in each subsequent stage, the distillation space has a subsequent pressure that is lower than a subsequent pressure in a previous stage.

16. The method of claim 15, wherein, in each subsequent stage, a subsequent temperature is lower than a subsequent temperature in a previous stage.

17. The method of claim 11, wherein, in each stage, the heating step is by steam in tubes and, in each subsequent stage, steam in the tubes is the evaporated portion of the feed material or distillate from a previous stage.

18. The method of claim 11, wherein each R' group represents different alkyl groups.

19. The method of claim 11, wherein the organometallic compound of Formula I is selected from the group consisting of $Me_2Sn(NMe_2)_2$, $Me_2Sn(NEtMe)_2$, $t\text{-}BuSn(NEtMe)_3$, $t\text{-}BuSn(NMe_2)_3$, $t\text{-}BuSn(NEt_2)_3$, $i\text{-}PrSn(NEtMe)_3$, $i\text{-}PrSn(NEtMe_2)_3$, $n\text{-}PrSn(NEtMe)_3$, $n\text{-}PrSn(NEtMe_2)_3$, $EtSn(NEtMe)_3$, $i\text{-}BuSn(NEtMe)_3$, $i\text{-}BuSn(NEtMe_2)_3$, $n\text{-}BuSn(NMe_2)_3$, $sec\text{-}BuSn(NMe_2)_3$, $Et_2Sn(NEtMe)_2$, $Me_2Sn(NEtMe)_2$, $Sn(NMe_2)_4$, $Sn(NEt_2)_4$, $Sn(NEtMe)_4$, $Bu_2Sn(NEtMe)_2$, and $Me_2Sn(NEt_2)_2$.

20. The method of claim 19, wherein the organometallic compound of Formula I is $Sn(NMe_2)_4$.

21. The method of claim 11, wherein at least one of the reduced first pressure and the reduced subsequent pressure are less than $10^{-1}$ torr.

* * * * *

UNITED STATES PATENT AND TRADEMARK OFFICE
CERTIFICATE OF CORRECTION

| | | |
|---|---|---|
| PATENT NO. | : 11,643,422 B2 | Page 1 of 1 |
| APPLICATION NO. | : 16/834361 | |
| DATED | : May 9, 2023 | |
| INVENTOR(S) | : Rajesh Odedra et al. | |

It is certified that error appears in the above-identified patent and that said Letters Patent is hereby corrected as shown below:

In the Claims

Column 13, Line 35 in Claim 1, replace:
"$R_x$—Sn—$A_{4-x}$"
With:
--$R_x$—Sn—$(NR'_2)_{4-x}$--

Signed and Sealed this
Twentieth Day of February, 2024

*Katherine Kelly Vidal*
Katherine Kelly Vidal
*Director of the United States Patent and Trademark Office*